(12) United States Patent
Crandall

(10) Patent No.: US 9,159,743 B2
(45) Date of Patent: *Oct. 13, 2015

(54) RADIO-FREQUENCY SWITCHES HAVING SILICON-ON-INSULATOR FIELD-EFFECT TRANSISTORS WITH REDUCED LINEAR REGION RESISTANCE

(71) Applicant: Skyworks Solutions, Inc., Woburn, MA (US)

(72) Inventor: Jonathan Christian Crandall, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 93 days.

This patent is subject to a terminal disclaimer.

(21) Appl. No.: 13/672,457

(22) Filed: Nov. 8, 2012

(65) Prior Publication Data

US 2013/0130630 A1    May 23, 2013

Related U.S. Application Data

(60) Provisional application No. 61/557,709, filed on Nov. 9, 2011.

(51) Int. Cl.

| | |
|---|---|
| *H04B 1/28* | (2006.01) |
| *H01L 29/74* | (2006.01) |
| *H01L 27/12* | (2006.01) |
| *H01L 29/78* | (2006.01) |
| *H04B 1/38* | (2015.01) |
| *H01L 29/66* | (2006.01) |
| *H01L 29/06* | (2006.01) |
| *H01L 29/417* | (2006.01) |

(52) U.S. Cl.
CPC ........ *H01L 27/1211* (2013.01); *H01L 29/0692* (2013.01); *H01L 29/66568* (2013.01); *H01L 29/78* (2013.01); *H04B 1/38* (2013.01); *H01L 29/41758* (2013.01)

(58) Field of Classification Search
CPC ... H01L 29/41758; H01L 27/12; H01L 29/07; H01L 29/78; H01L 29/0692; H01L 29/66568; H01L 27/1211; H04B 1/38
USPC ................ 455/73, 78, 82, 83, 550, 90.3, 333; 438/587, 128, 197, 129, 270, 588–589; 257/341, 347
See application file for complete search history.

(56) References Cited

U.S. PATENT DOCUMENTS

| | | | | |
|---|---|---|---|---|
| 4,880,309 | A | * | 11/1989 | Wanta ........................... 356/401 |
| 5,391,895 | A | * | 2/1995 | Dreifus ........................... 257/77 |
| 5,528,372 | A | * | 6/1996 | Kawashima .................. 356/401 |

(Continued)

OTHER PUBLICATIONS

International Search Report and Written Opinion re International Application No. PCT/US2012/064230 mailed on Mar. 12, 2013.

*Primary Examiner* — Pablo Tran
(74) *Attorney, Agent, or Firm* — Knobbe, Martens, Olson & Bear LLP

(57) ABSTRACT

Disclosed are devices and methods related to radio-frequency (RF) switches having silicon-on-insulator (SOI) field-effect transistors (FETs). In some embodiments, an RF switch can include an FET with shaped source, drain, and gate selected to yield a reduced per-area value of resistance in linear operating region (Rds-on). In some implementations, a plurality of such FETs can be connected in series to allow use of SOI technology in high power RF switching applications while maintaining a relatively small die size.

20 Claims, 21 Drawing Sheets

(56) References Cited

U.S. PATENT DOCUMENTS

| | | | |
|---|---|---|---|
| 5,675,418 A * | 10/1997 | Bae et al. | 356/399 |
| 6,097,114 A * | 8/2000 | Hazelton | 310/12.06 |
| 6,222,230 B1 * | 4/2001 | Gardner et al. | 257/329 |
| 6,867,083 B2 * | 3/2005 | Imam et al. | 438/212 |
| 7,026,215 B2 * | 4/2006 | Aoki et al. | 438/270 |
| 7,064,051 B2 * | 6/2006 | Lee et al. | 438/587 |
| 7,094,674 B2 * | 8/2006 | Graf et al. | 438/598 |
| 7,192,857 B1 * | 3/2007 | Hopper et al. | 438/587 |
| 7,211,478 B1 * | 5/2007 | Pelham et | 438/197 |
| 7,265,041 B2 * | 9/2007 | Wu et al. | 438/587 |
| 7,515,882 B2 * | 4/2009 | Kelcourse et al. | 455/78 |
| 7,869,770 B2 * | 1/2011 | Kelcourse | 455/78 |
| 8,265,569 B2 * | 9/2012 | Barlow | 455/78 |
| 8,686,507 B2 * | 4/2014 | Su et al. | 257/355 |
| 2004/0245638 A1 | 12/2004 | Nemtsev et al. | |
| 2005/0161735 A1 | 7/2005 | Aoki et al. | |
| 2007/0138549 A1 | 6/2007 | Wu et al. | |
| 2010/0002345 A1 | 1/2010 | Young et al. | |
| 2011/0294444 A1 * | 12/2011 | Kawano | 455/83 |
| 2013/0115895 A1 | 5/2013 | Crandall | |
| 2014/0011463 A1 * | 1/2014 | Madan et al. | 455/78 |

\* cited by examiner

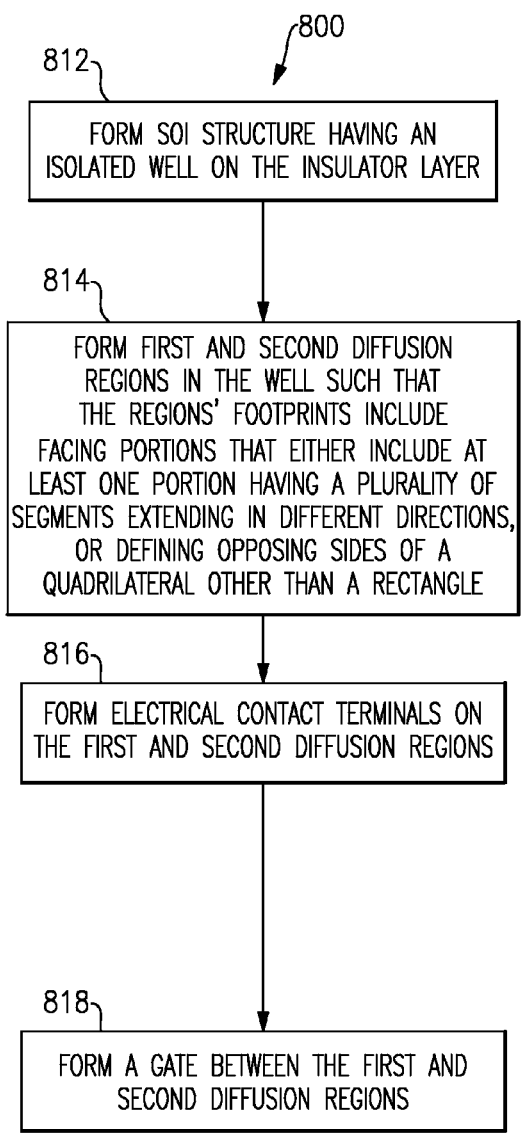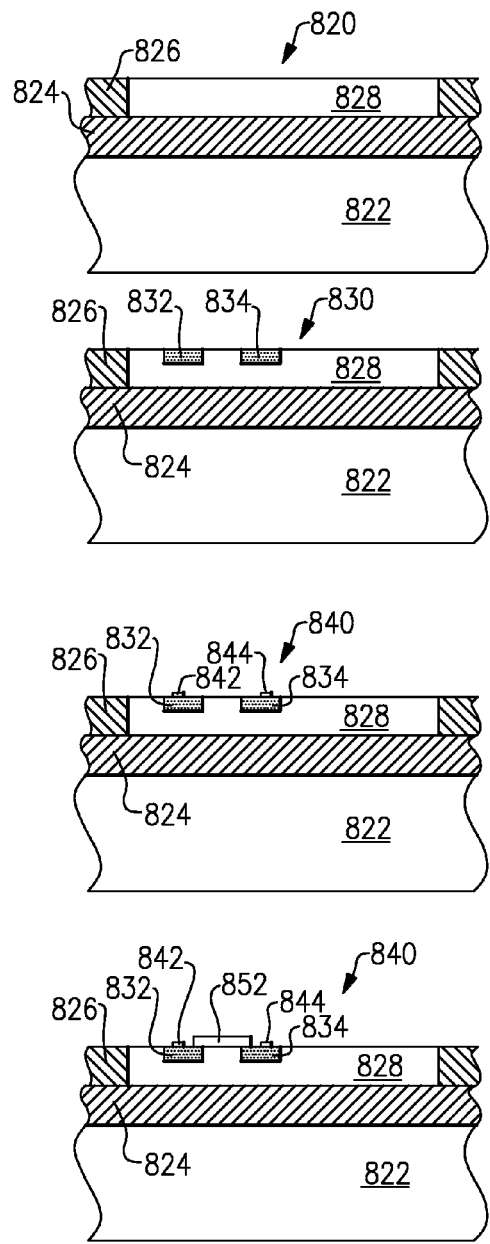
FIG. 24
FIG. 25

RADIO-FREQUENCY SWITCHES HAVING SILICON-ON-INSULATOR FIELD-EFFECT TRANSISTORS WITH REDUCED LINEAR REGION RESISTANCE

CROSS-REFERENCE TO RELATED APPLICATIONS

This application claims priority to U.S. Provisional Application No. 61/557,709 filed Nov. 9, 2011 and entitled "DEVICES AND METHODOLOGIES RELATED TO A FET-BASED RF SWITCH HAVING A REDUCED PRODUCT OF RDS-ON AND AREA," which is expressly incorporated by reference herein in its entirety.

BACKGROUND

1. Field

The present disclosure generally relates to field-effect transistor (FET) structures and radio-frequency (RF) devices such as switches having such FET structures.

2. Description of the Related Art

A field-effect transistor (FET) can be utilized as a switch for radio-frequency (RF) applications. FET-based switches, such as silicon-on-insulator (SOI) switches are used in, for example, antenna switch modules and front-end modules. Such applications typically benefit from a SOI transistor feature of ideal or nearly ideal isolation.

Typically, an SOI device is rated for only a few volts. Accordingly, several SOI switches having relatively large width/length ratio can be arranged in series to provide RF switching functionality. Such a configuration voltage-divides the RF signal being switched, thereby mitigating breakdown concerns and improving reliability in conditions involving, for example, high RF power/voltage or high voltage standing wave ratio (VSWR).

SUMMARY

In a number of implementations, the present disclosure relates to a transistor that includes a semiconductor substrate, a plurality of first diffusion regions formed on the semiconductor substrate, and a plurality of second diffusion regions formed on the semiconductor substrate. The transistor further includes a gate layer disposed over the first and second diffusion regions. The gate layer defines a first opening over each of the first diffusion regions and a second opening over each of the second diffusion regions. At least some of the first and second openings have a shape other than a rectangle.

In some embodiments, the transistor can further include a contact feature formed on each the first and second diffusion regions. In some embodiments, the transistor can further include a first conductor that electrically connects the contact features on the first diffusion regions. In some embodiments, the transistor can further include a second conductor that electrically connects the contact features on the second diffusion regions. The first conductor can be further connected to a source terminal and the second conductor can be further connected to a drain terminal.

In some embodiments, at least some of the first and second openings have a first shape defined by an outline of an elongate shape having a center and an elongation axis along a first direction and a diamond shape having its center positioned approximately at the center of the elongate shape. The diamond shape can be oriented so that one set of opposing corners are along the elongation axis and the other set of opposing corners are substantially perpendicular to the elongation axis.

In some embodiments the elongate shape can include a rectangle having its length along the first direction. In some embodiments, the elongate shape can include a hexagon elongated along the first direction. The plurality of first openings having the first shape can form a first column, with the first openings in the first column being arranged along a second direction that is approximately perpendicular to the first direction. The plurality of second openings having the first shape can form a second column, with the second openings in the second column being arranged along the second direction and offset from the first openings along the first direction. The first openings of the first column and the second openings of the second column can be staggered along the first direction and along the second direction. Each of the first conductor and the second conductor can extend along the second direction.

In some embodiments, the transistor can further include a third column having additional first openings that are staggered from the second openings of the second column along the first direction and the second direction. In some embodiments, the transistor can further include a fourth column having additional second openings that are staggered from the first openings of the third column along the first direction and the second direction.

In some embodiments, a neighboring pair of first and second openings can include a first facing portion for the first opening and a second facing portion for the second opening. At least one of the first and second facing portions can have a plurality of segments that extend in different directions.

In some embodiments, a neighboring pair of first and second openings can include a first facing portion for the first opening and a second facing portion for the second opening. The first and second facing portions can define opposing sides of a quadrilateral other than a rectangle.

In some embodiments, the transistor can be a field effect transistor (FET), with the plurality of first diffusion regions being a source of the FET, and the plurality of second diffusion regions being a drain of the FET. The FET can include an n-type FET or a p-type FET. The FET can include a metal-oxide-semiconductor FET (MOSFET).

In some embodiments, the transistor can further include an insulator layer disposed below the semiconductor substrate. The semiconductor substrate can include a silicon substrate so as to yield a silicon-on-insulator (SOI) structure.

In some embodiments, the shape can be dimensioned to yield a reduced value of Rds-on per area when compared to a transistor having a similar sized rectangular opening.

In accordance with a number of implementations, the present disclosure relates to a method for fabricating a transistor. The method includes providing a semiconductor substrate. The method further includes forming a plurality of first diffusion regions on the semiconductor substrate, and forming a plurality of second diffusion regions on the semiconductor substrate. The method further includes forming a gate layer disposed over the first and second diffusion regions. The gate layer defines a first opening over each of the first diffusion regions and a second opening over each of the second diffusion regions. At least some of the first and second openings have a shape other than a rectangle.

According to some teachings, the present disclosure relates to a mask for fabricating a semiconductor transistor. The mask includes a plurality of features that allow formation of a gate layer over a semiconductor substrate, such that the formed gate layer defines a first opening and a second opening, with at least some of the first and second openings having a shape other than a rectangle.

In a number of implementations, the present disclosure relates to a semiconductor die that includes a semiconductor substrate and a plurality of transistors implemented on the substrate. Each transistor includes a plurality of first diffusion regions and a plurality of second diffusion regions. Each transistor further includes a gate layer disposed over the first and second diffusion regions, with the gate layer defining a first opening over each of the first diffusion regions and a second opening over each of the second diffusion regions. At least some of the first and second openings have a shape other than a rectangle.

In some embodiments, the plurality of transistors can be connected in series to form a switchable conduction path for a radio-frequency (RF) signal.

In some implementations, the present disclosure relates to a semiconductor module having a packaging substrate configured to receive plurality of components, and a die mounted on the packaging substrate. The die includes a plurality of transistors implemented on a semiconductor substrate. Each transistor includes a plurality of first diffusion regions and a plurality of second diffusion regions. Each transistor further includes a gate layer disposed over the first and second diffusion regions, with the gate layer defining a first opening over each of the first diffusion regions and a second opening over each of the second diffusion regions. At least some of the first and second openings have a shape other than a rectangle. The module further includes a plurality of connectors configured to provide electrical connections between the die and the packaging substrate.

In accordance with some implementations, the present disclosure relates to a radio-frequency (RF) device having a transceiver configured to process RF signals, a power amplifier configured to amplify an RF signal generated by the transceiver, and an antenna in communication with the transceiver and configured to facilitate transmission of the amplified RF signal. The RF device further includes a switching module coupled to the power amplifier and the antenna. The switching module is configured to route the amplified RF signal from the power amplifier to the antenna. The switching module has a switch circuit including a plurality of transistors connected in series. Each transistor includes a plurality of first diffusion regions and a plurality of second diffusion regions. Each transistor further includes a gate layer disposed over the first and second diffusion regions, with the gate layer defining a first opening over each of the first diffusion regions and a second opening over each of the second diffusion regions. At least some of the first and second openings have a shape other than a rectangle.

In some implementations, the present disclosure relates to a radio-frequency (RF) switch that includes a semiconductor substrate and an input assembly having a plurality of source regions formed on the semiconductor substrate, a source contact formed on each of the source regions, and an input conductor that electrically connects to each of the source contacts. The RF switch further includes an output assembly having a plurality of drain regions formed on the semiconductor substrate, a drain contact formed on each of the drain regions, and an output conductor that electrically connects to each of the drain contacts. The RF switch further includes a gate layer disposed over the source and drain regions, with the gate layer defining a first opening over each of the source regions and a second opening over each of the drain regions. At least some of the first and second openings are arranged in a two-dimensional array.

In some embodiments, the RF switch can further include an input terminal connected to the input conductor and an output terminal connected to the output conductor.

In some embodiments, each of the first and second openings can have a parallelogram shape. The first and second openings can be arranged so that neighboring sides of a pair of openings are substantially parallel, with each of the input and output conductors extending diagonally over the corresponding ones of the first and second openings. In some embodiments, the parallelogram shape can be a square shape such that the array of the squares defines a waffle pattern.

In some embodiments, at least some of the first and second openings can have a first shape defined by an outline of an elongate shape having a center and an elongation axis along a first direction and a diamond shape having its center positioned approximately at the center of the elongate shape. The diamond shape can be oriented so that one set of opposing corners are along the elongation axis and the other set of opposing corners are substantially perpendicular to the elongation axis. The elongate shape can include a rectangle having its length along the first direction. The elongate shape can include a hexagon elongated along the first direction. The plurality of first openings having the first shape can form a first column, with the first openings in the first column being arranged along a second direction that is approximately perpendicular to the first direction. The plurality of second openings having the first shape can form a second column, with the second openings in the second column being arranged along the second direction and offset from the first openings along the first direction. The first openings of the first column and the second openings of the second column can be staggered along the first direction and along the second direction. Each of the input conductor and the output conductor can extend along the second direction.

In some embodiments, the RF switch can further include a third column having additional first openings that are staggered from the second openings of the second column along the first direction and the second direction. In some embodiments, the RF switch can further include a fourth column having additional second openings that are staggered from the first openings of the third column along the first direction and the second direction.

In some embodiments, a neighboring pair of first and second openings can include a first facing portion for the first opening and a second facing portion for the second opening. At least one of the first and second facing portions can have a plurality of segments that extend in different directions.

In some embodiments, a neighboring pair of first and second openings can include a first facing portion for the first opening and a second facing portion for the second opening. The first and second facing portions can define opposing sides of a quadrilateral other than a rectangle.

In some embodiments, the source regions, the drain regions, and the gate can be configured as a metal-oxide-semiconductor FET (MOSFET).

In some embodiments, the RF switch can further include an insulator layer disposed below the semiconductor substrate. The semiconductor substrate can include a silicon substrate so as to yield a silicon-on-insulator (SOI) structure.

In some embodiments, the shape can be dimensioned to yield a reduced value of Rds-on per area when compared to a transistor having a similar sized rectangular opening.

According to a number of implementations, the present disclosure relates to a method for fabricating a radio-frequency (RF) switch. The method includes providing a semiconductor substrate, forming a plurality of source regions on the semiconductor substrate, and forming a plurality of drain regions on the semiconductor substrate. The method further includes forming a gate layer over the source regions and the drain regions, with the gate layer defining a first opening over each of the source regions and a second opening over each of the drain regions. At least some of the first and second openings are arranged in a two-dimensional array. The method further includes forming a contact on each of the source and drain regions, and forming an input conductor that electrically connects the source contacts and an output conductor that electrically connects the drain contacts.

In accordance with a number of teachings, the present disclosure relates to a radio-frequency (RF) switch die having a semiconductor substrate and a plurality of transistors implemented on the substrate. Each transistor includes a plurality of source regions and a plurality of drain regions. Each transistor further includes a gate layer disposed over the source and drain regions, with the gate layer defining a first opening over each of the source regions and a second opening over each of the drain regions. At least some of the first and second openings are arranged in a two-dimensional array. The die further includes a source contact formed on each source region, and a drain contact formed on each drain region. The die further includes an input conductor that electrically connects the source contacts, and an output conductor that electrically connects the drain contacts.

In a number of implementations, the present disclosure relates to a radio-frequency (RF) switching module having a packaging substrate configured to receive plurality of components, and a die mounted on the packaging substrate. The die has a plurality of transistors implemented on a semiconductor substrate. Each transistor includes a plurality of source regions and a plurality of drain regions. Each transistor further includes a gate layer disposed over the source and drain regions, with the gate layer defining a first opening over each of the source regions and a second opening over each of the drain regions. At least some of the first and second openings are arranged in a two-dimensional array. Each transistor further includes a source contact formed on each source region, and a drain contact formed on each drain region. The die further includes an input conductor that electrically connects the source contacts, and an output conductor that electrically connects the drain contacts. The module further includes a plurality of connectors configured to provide electrical connections between the die and the packaging substrate.

In some implementations, the present disclosure relates to a radio-frequency (RF) device. The RF device includes a transceiver configured to process RF signals, a power amplifier configured to amplify an RF signal generated by the transceiver, and an antenna in communication with the transceiver and configured to facilitate transmission of the amplified RF signal. The RF device further includes a switching module coupled to the power amplifier and the antenna. The switching module is configured to route the amplified RF signal from the power amplifier to the antenna. The switching module has a switch circuit including a plurality of transistors connected in series. Each transistor includes a plurality of source regions and a plurality of drain regions. Each transistor further includes a gate layer disposed over the source and drain regions, with the gate layer defining a first opening over each of the source regions and a second opening over each of the drain regions. At least some of the first and second openings are arranged in a two-dimensional array. Each transistor further includes a source contact formed on each source region, and a drain contact formed on each drain region. The source contacts are connected to an input conductor for receiving the amplified RF signal, and the drain contacts are connected to an output conductor for outputting the amplified RF signal.

In some implementations, the present disclosure relates to a switching apparatus that includes a semiconductor substrate having a surface. The apparatus further includes a plurality of diffusion regions formed on the substrate so as to define one or more shapes on the surface of the substrate. The apparatus further includes one or more first conductors electrically connected to selected ones of the diffusion regions, with the one or more first conductors capable of being connected together as an input for the switching apparatus. The apparatus further includes one or more second conductors electrically connected to remaining ones of the diffusion regions, with the one or more second conductors capable of being connected together as an output for the switching apparatus. At least some of the one or more shapes associated with the one or more first conductors and at least some of the one or more shapes associated with the one or more second conductors are dimensioned so as to include a first facing portion and a second facing portion that generally face each other and thereby belong to a neighboring pair of diffusion regions. At least one of the first and second facing portions has a plurality of segments that extend in different directions or the first and second facing portions define opposing sides of a quadrilateral other than a rectangle.

In some embodiments, the apparatus can further include a feature formed between the plurality of diffusion regions and configured to allow control of flow of charge between the regions connected to the one or more first conductors and the regions connected to the one or more second conductors. Such a feature can include gate feature, and the plurality of diffusion regions connected to the one or more first conductors can correspond to a source of a field effect transistor (FET). The plurality of diffusion regions can be connected to the one or more second conductors corresponding to a drain of the FET. Such a FET can include an n-type FET or a p-type FET. Such a FET can include a metal-oxide-semiconductor FET (MOSFET).

In some embodiments, the apparatus can further include terminals formed on the plurality of diffusion regions so as to provide electrical connections between the diffusion regions and their respective conductors. The apparatus can further include a source conductor layer configured to electrically connect the one or more first conductors, and a drain conductor layer configured to electrically connect the one or more second conductors.

In some embodiments, the apparatus can further include an insulator layer disposed below the semiconductor substrate. Such a semiconductor substrate can include a silicon substrate so as to yield a silicon-on-insulator (SOI) structure.

In some embodiments, wherein the one or more shapes can include a first cross shape associated with diffusion regions connected to the first conductors, with the first cross shape having substantially perpendicular extensions along X and Y directions, and the first cross shaped diffusion regions arranged along the X direction. The one or more shapes can further include a second cross shape associated with diffusion regions connected to the second conductors, with the second cross shape having substantially perpendicular extensions along the X and Y directions, and the second cross shaped diffusion regions arranged along the X direction and offset along the X direction from the first cross shaped diffusion regions.

In some embodiments, the one or more shapes can further include a square shape associated with diffusion regions connected to the second conductors, with the square shape having sides along the X and Y directions, and the square shaped diffusion regions arranged along the X direction and offset along the X direction from the first cross shaped diffusion regions. The one or more first cross shape can further include a diamond shape at the center of the first cross shape.

In some embodiments, the first cross shape can include beveled corners at the ends of the extensions. The one or more shapes can further include a snowflake shape associated with diffusion regions connected to the second conductors, with the snowflake shape having a perimeter defined by a combination of first and second squares, and the first square having sides along the X and Y directions, and the second square rotated by about 45 degrees relative to the first square.

In some embodiments, the one or more shapes associated with diffusion regions connected to the first conductors can include a first hexagonal shape, and the one or more first hexagonal shaped diffusion regions can be arranged along an X direction. The one or more shapes associated with diffusion regions connected to the second conductors can include a second hexagonal shape, and the one or more second hexagonal shaped diffusion regions can be arranged along the X direction and offset along the X direction from the first hexagonal shaped diffusion regions.

In some embodiments, the one or more shapes can include a first double-diamond shape associated with diffusion regions connected to the first conductors, and the first double-diamond shape having first and second rhombus shapes can be joined along an X direction. The one or more first double-diamond shaped diffusion regions can be arranged in a zigzag pattern along the x direction. The one or more shapes can include a second double-diamond shape associated with diffusion regions connected to the second conductors, and the second double-diamond shape having first and second rhombus shapes can be joined along a Y direction. The one or more second double-diamond shaped diffusion regions can be arranged in a zigzag pattern along the X direction such that along a given X line.

In some embodiments, the one or more shapes can include a first double-diamond shape associated with diffusion regions connected to the first conductors, and the first double-diamond shape having first and second rhombus shapes can be joined along a direction at an angle of about 45 degrees from an X direction. The one or more first double-diamond shaped diffusion regions can be arranged along the X direction. The one or more shapes can include a second double-diamond shape associated with diffusion regions connected to the second conductors, and the second double-diamond shape having first and second rhombus shapes can be joined along a direction at an angle of about 45 degrees from the X direction. The one or more second double-diamond shaped diffusion regions can be arranged along the X direction and offset along the X direction from the first double-diamond shaped diffusion regions.

In some embodiments, the one or more shapes can include a first hexagonal shape associated with diffusion regions connected to the first conductors, with the first hexagonal shape stretched along a Y direction, and the one or more first hexagonal shaped diffusion regions can be arranged along an X direction. The one or more shapes can include a second hexagonal shape associated with diffusion regions connected to the second conductors, with the second hexagonal shape stretched along the Y direction, and the one or more second hexagonal shaped diffusion regions can be arranged along the X direction and offset along the X direction from the first hexagonal shaped diffusion regions. The one or more shapes can further include a diamond shape at the center of each of the first and second hexagonal shapes. Each of the first and second hexagonal shapes can include tapered corners of the diamond shape along the X direction. The one or more shapes can further include a second stretched hexagonal shape at the center of each of the first and second stretched hexagonal shapes and having a Y dimension between those of the respective stretched hexagonal shape and its corresponding diamond shape.

In some embodiments, the one or more shapes can include a first rectangular shape associated with diffusion regions connected to the first conductors, with the first rectangular shape stretched along a Y direction, and the one or more first rectangular shaped diffusion regions can be arranged along an X direction. The one or more shapes can include a second rectangular shape associated with diffusion regions connected to the second conductors, with the second rectangular shape stretched along the Y direction, and the one or more second rectangular shaped diffusion regions can be arranged along the X direction and offset along the X direction from the first rectangular shaped diffusion regions. The one or more shapes can further include a diamond shape at the center of each of the first and second stretched rectangular shapes.

In some embodiments, the one or more shapes can include a first cross shape associated with diffusion regions connected to the first conductors, with the first cross shape having substantially perpendicular extensions along directions that are about 45 degrees relative to X and Y directions, and the one or more first cross shaped diffusion regions can be arranged along the X direction. The one or more shapes can include a second cross shape associated with diffusion regions connected to the second conductors, with the second cross shape having substantially perpendicular extensions along directions that are about 45 degrees relative to the X and Y directions, and the one or more second cross shaped diffusion regions can be arranged along the X direction and offset along the X direction from the first cross shaped diffusion regions. Each of the first and second cross shapes can be dimensioned so that the two extensions from a center of the shape along a given 45 degree direction are offset on opposite sides along the 45 degree line. Each offset extension can include a beveled end corner on the side of the extension further away from the 45 degree line. Each of the first and second cross shapes can further include a diamond shape about a center of each cross shape.

In some embodiments, the one or more shapes can include an octagonal shape associated with diffusion regions connected to the first conductors, and the one or more octagonal shaped diffusion regions can be arranged along an X direction. The octagonal shape can include a first stretched octagonal shape, with the first stretched direction at an angle of about 45 degrees relative to the X direction. The one or more shapes can include a second stretched octagonal shape associated with diffusion regions connected to the second conductors, with the stretched direction being at an angle of about 45 degrees relative to the X direction, and the one or more second stretched octagonal shaped diffusion regions can be arranged along the X direction and offset along the X direction from the first stretched octagonal shaped diffusion regions.

According to a number of implementations, the present disclosure relates to a radio-frequency (RF) switching device having a plurality of transistor switches arranged in series. Each switch has an input and an output such that an output of an intermediate switch acts as an input of its neighboring switch. Each switch includes a feature configured to allow control of flow of charge between the input and the output. Each switch further includes a semiconductor substrate having a surface; a plurality of diffusion regions formed on the substrate so as to define one or more shapes on the surface of the substrate; one or more first conductors electrically connected to selected ones of the diffusion regions, with the one or more first conductors capable of being connected together as an input for the switching apparatus; and one or more second conductors electrically connected to remaining ones of the diffusion regions, with the one or more second conductors capable of being connected together as an output for the switching apparatus. At least some of the one or more shapes associated with the one or more first conductors and at least some of the one or more shapes associated with the one or more second conductors are dimensioned so as to include a first facing portion and a second facing portion that generally face each other and thereby belong to a neighboring pair of diffusion regions. At least one of the first and second facing portions has a plurality of segments that extend in different directions or the first and second facing portions define opposing sides of a quadrilateral other than a rectangle.

In some embodiments, the semiconductor substrate can include a silicon substrate. The RF switching device can further include an insulator layer below the silicon substrate so as to yield a silicon-on-insulator (SOI) structure so as to provide high isolation and high $R_{ON}/C_{OFF}$ figure of merit. Each transistor switch can include a MOSFET switch such that the input includes a source. The feature for controlling the flow of charge can include a gate, and the output can include a drain. The number of switches can be selected so as to allow voltage division of high power RF signals, with each divided voltage being selected to be less than a breakdown voltage of the SOI structure. Dimensions and arrangement of the first and second facing portions can be selected so as to yield a relatively low product of $R_{DS-ON}$ and area of each switch.

In accordance with some embodiments, the present disclosure relates to an antenna switch module for a wireless device. The module includes a switching device configured to switch one or more RF signals to and from one or more antennas. The switching device includes a plurality of transistor switches, with each switch having an input and an output such that an output of an intermediate switch acts as an input of its neighboring switch, and each switch including a feature configured to allow control of flow of charge between the input and the output. Each switch further includes a semiconductor substrate having a surface; a plurality of diffusion regions formed on the substrate so as to define one or more shapes on the surface of the substrate; one or more first conductors electrically connected to selected ones of the diffusion regions, with the one or more first conductors capable of being connected together as an input for the switching apparatus; and one or more second conductors electrically connected to remaining ones of the diffusion regions, with the one or more second conductors capable of being connected together as an output for the switching apparatus. At least some of the one or more shapes associated with the one or more first conductors and at least some of the one or more shapes associated with the one or more second conductors are dimensioned so as to include a first facing portion and a second facing portion that generally face each other and thereby belong to a neighboring pair of diffusion regions. At least one of the first and second facing portions has a plurality of segments that extend in different directions or the first and second facing portions define opposing sides of a quadrilateral other than a rectangle. The module further includes one or more antenna ports configured to allow connections to the one or more antennas. The module further includes one or more RF ports configured to allow routing of the one or more RF signals to and/or from the one or more antennas.

In a number of embodiments, the present disclosure relates to a front-end module for a wireless device. The module includes a switching device configured to switch one or more RF signals to and from one or more antennas, with the switching device including a plurality of transistor switches, and each switch having an input and an output such that an output of an intermediate switch acts as an input of its neighboring switch. Each switch includes a feature configured to allow control of flow of charge between the input and the output. Each switch further includes a semiconductor substrate having a surface; a plurality of diffusion regions formed on the substrate so as to define one or more shapes on the surface of the substrate; one or more first conductors electrically connected to selected ones of the diffusion regions, with the one or more first conductors capable of being connected together as an input for the switching apparatus; and one or more second conductors electrically connected to remaining ones of the diffusion regions, with the one or more second conductors capable of being connected together as an output for the switching apparatus. At least some of the one or more shapes associated with the one or more first conductors and at least some of the one or more shapes associated with the one or more second conductors are dimensioned so as to include a first facing portion and a second facing portion that generally face each other and thereby belong to a neighboring pair of diffusion regions. At least one of the first and second facing portions has a plurality of segments that extend in different directions or the first and second facing portions define opposing sides of a quadrilateral other than a rectangle. The module further includes one or more input RF ports configured to receive and provide the one or more RF signals to the switching device. The module further includes one or more output RF ports configured to receive an output RF signal from the switching device and route the output RF signal to a desired destination.

According to a number of embodiments, the present disclosure relates to a wireless device having a transceiver configured to process received an RF signal and transmit an RF signal. The wireless device further includes an antenna configured to facilitate receiving of the received RF signal and transmission of the transmit signal. The wireless device further includes at least one switching module configured to allow routing of a desired RF signal between the transceiver and the antenna. The switching device has one or more inputs and one or more outputs. The switching device further includes one or more MOSFET SOI transistor switches arranged in series, with each switch including one or more diffusion regions having a first shape on the surface of the substrate and one or more diffusion regions having a second shape on the surface of the substrate. The first and second shapes are dimensioned so as to include first and second facing portions that generally face each other. At least one of the first and second facing portions has a plurality of segments that extend in different directions or the first and second facing portions define opposing sides of a quadrilateral other than a rectangle. The switching device further includes one or more source conductors that interconnect the one or more first shaped diffusion regions and one or more drain connectors that interconnect the one or more second shaped diffusion regions. The MOSFET SOI transistor switches can be configured so as to provide high isolation and high $R_{ON}/C_{OFF}$ figure of merit. The first and second shapes of the diffusion regions can be selected so as to yield a relatively low product of $R_{DS-ON}$ and area of the switching module.

In some implementations, the present disclosure relates to a method for fabricating a radio-frequency (RF) switching device. The method includes providing or forming a silicon-on-insulator (SOI) structure having an isolated well on an insulator layer. The method further includes forming one or more source regions and one or more drain regions in the well, with the one or more source regions including a first shape, and the one or more drain regions including a second shape. The first and second shapes are dimensioned so as to include first and second facing portions that generally face each other. At least one of the first and second facing portions has a plurality of segments that extend in different directions or the first and second facing portions define opposing sides of a quadrilateral other than a rectangle. The method further includes forming a gate between the one or more source regions and the one or more drain regions. The method further includes forming one or more electrical conductors that interconnect each of the one or more source regions. The method further includes forming one or more electrical conductors that interconnect each of the one or more drain regions.

In some implementations, the present disclosure relates to a radio-frequency (RF) switch having a semiconductor substrate and a diffusion layer formed on the substrate. The RF switch further includes a gate layer formed on the diffusion layer. The gate layer defines a plurality of shaped openings arranged in a two-dimensional manner and exposes opening-shaped regions of the diffusion layer. Each of the opening-shaped regions is grouped as either a source region or a drain region. The RF switch further includes an electrical contact formed on each of the opening-shaped regions. The RF switch further includes one or more source conductors configured to electrically connect the electrical contacts associated with the source regions, and one or more drain conductors configured to electrically connect the electrical contacts associated with the drain regions.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 13/672,410, titled "DEVICES AND METHODS RELATED TO FIELD-EFFECT TRANSISTOR STRUCTURES FOR RADIO-FREQUENCY APPLICATIONS" filed on even date herewith and hereby incorporated by reference herein in its entirety.

BRIEF DESCRIPTION OF THE DRAWINGS

FIG. 24 shows a process that can be implemented to fabricate one or more FET devices having one or more features as described herein.

FIG. 25 shows various stages of fabrication associated with the process of FIG. 24.

DETAILED DESCRIPTION OF SOME EMBODIMENTS

The headings provided herein, if any, are for convenience only and do not necessarily affect the scope or meaning of the claimed invention.

Disclosed herein are devices and method related to semiconductor transistors having one or more desirable performance features. Such transistors are described herein in the context of field effect transistors (FETs) implemented as silicon-on-insulator (SOI) devices. It will be understood, however, that one or more features of the present disclosure can also be implemented in other types of transistors and/or other process technologies. For example, bipolar junction transistors (BJTs) can be configured to include one or more features of the present disclosure. In another example, transistors associated with non-SOI process technologies can be configured to include one or more features of the present disclosure.

Various examples of FETs are described herein in the context of switching of radio-frequency (RF) signals. It will be understood, however, that one or more features of the present disclosure can also be implemented in other types of applications.

Figure 1A:
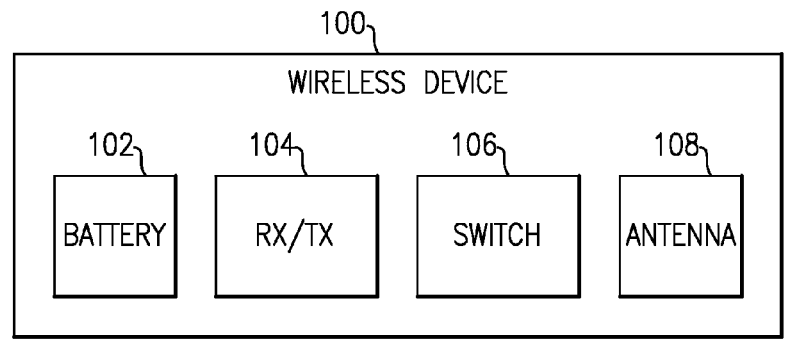
FIG. 1A schematically depicts a wireless device having a switching component that can be configured to include one or more features of the present disclosure.

FIG. 1A shows that in some embodiments, one or more features of the present disclosure can be implemented in a wireless device 100 such as a cellular phone, smart phone, tablet, or any other portable device configured for voice and/or data communication. The wireless device 100 is depicted as including a battery 102 or a receptacle for receiving a battery. Such a battery can provide power to a number of other components in the wireless device 100.

The wireless device 100 is depicted as further including a component 104 configured to generate transmit signals and/or process received signals. In some embodiments, such transmission and reception functionalities can be implemented in separate components (e.g., a transmit module and receiving module), or be implemented in a same module (e.g., a transceiver module).

In some embodiments, one or more features of the present disclosure can be implemented in devices configured to perform both transmission and reception of RF signals (e.g., a wireless transceiver), in devices configured to receive only (e.g., a wireless receiver), or in devices configured to transmit only (e.g., a wireless transmitter).

The wireless device 100 is depicted as further including a switch component 106. Such a component can include, for example, an antenna switch module and/or a front-end module. In some embodiments, one or more features associated with FET switches as described herein can be implemented in the switch component 106.

The wireless device 100 is depicted as further including an antenna component 108. Such a component can include one or more antennas to facilitate transmission and/or reception of RF signals.

Figure 1B:
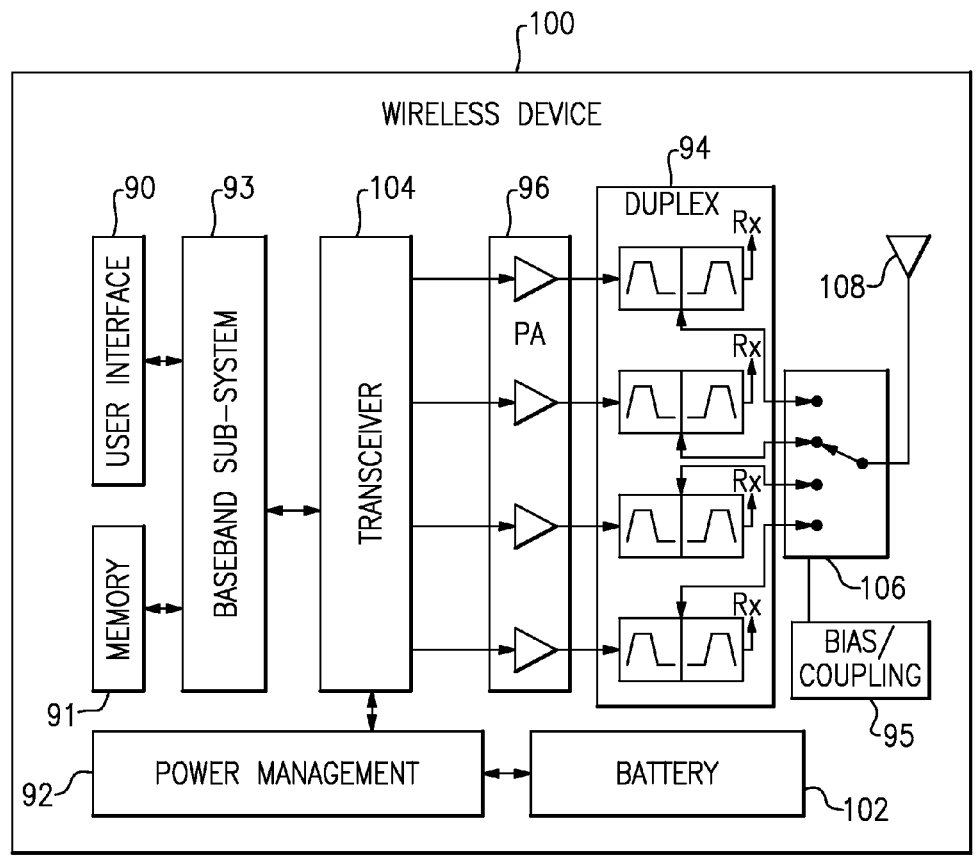
FIG. 1B schematically depicts a more specific example of the wireless device of FIG. 1A.

FIG. 1B shows a more specific example of how the wireless device 100 of FIG. 1A can be implemented. In FIG. 1B, an example wireless device 100 shown to include one or more switches having configurations as described herein. For example, a switch 106 can be configured to provide switching between, for example, different bands and/or modes, transmit and receive modes, etc.

In the example wireless device 100, a power amplifier (PA) module 96 having a plurality of PAs can provide an amplified RF signal to the switch 106 (via a duplexer 93), and the switch 106 can route the amplified RF signal to an antenna 108. The PA module 96 can receive an unamplified RF signal from a transceiver 104 that can be configured and operated in known manners. The transceiver 104 can also be configured to process received signals. The transceiver 104 is shown to interact with a baseband sub-system 93 that is configured to provide conversion between data and/or voice signals suitable for a user and RF signals suitable for the transceiver 104. The transceiver 104 is also shown to be connected to a power management component 92 that is configured to manage power for the operation of the wireless device 100. Such a power management component can also control operations of the baseband sub-system 93 and other components of the wireless device 100.

The baseband sub-system 93 is shown to be connected to a user interface 90 to facilitate various input and output of voice and/or data provided to and received from the user. The baseband sub-system 93 can also be connected to a memory 91 that is configured to store data and/or instructions to facilitate the operation of the wireless device, and/or to provide storage of information for the user.

In some embodiments, the duplexer 94 can allow transmit and receive operations to be performed simultaneously using a common antenna (e.g., 108). In FIG. 1B, received signals are shown to be routed to "Rx" paths (not shown) that can include, for example, a low-noise amplifier (LNA).

The example duplexer 94 is typically utilized for frequency-division duplexing (FDD) operation. It will be understood that other types of duplexing configurations can also be implemented. For example, a wireless device having a time-division duplexing (TDD) configuration can include respective low-pass filters (LPF) instead of the duplexers, and the switch (e.g., 106 in FIG. 1B) can be configured to provide band selection functionality, as well as Tx/Rx (TR) switching functionality.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 2A:
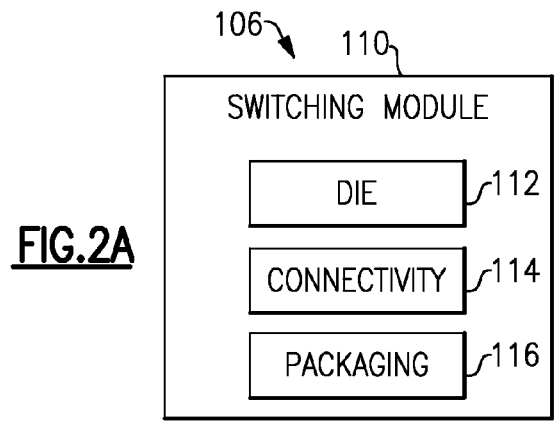
FIG. 2A schematically depicts a switching module that can be configured to include one or more features of the present disclosure.

FIG. 2A shows that in some embodiments, one or more features of the present disclosure can be implemented in a module such as a switching module 110. Such a module can be implemented as, for example, the switch component 106 described in reference to FIGS. 1A and 1B.

In FIG. 2A, the switching module 110 is depicted as including a die 112, a connectivity component 114, and a packaging component 116. The die 112 can include one or more FETs having one or more features as described herein. The connectivity component 114 can include parts and/or structures such as connectors and terminals that allow transfer of signals to and from the die 112 and transfer of power to circuits on the die 112. The packaging component 116 can include parts and/or structures that provide, for example, mounting substrate and protection of the die 112.

Figure 2B:
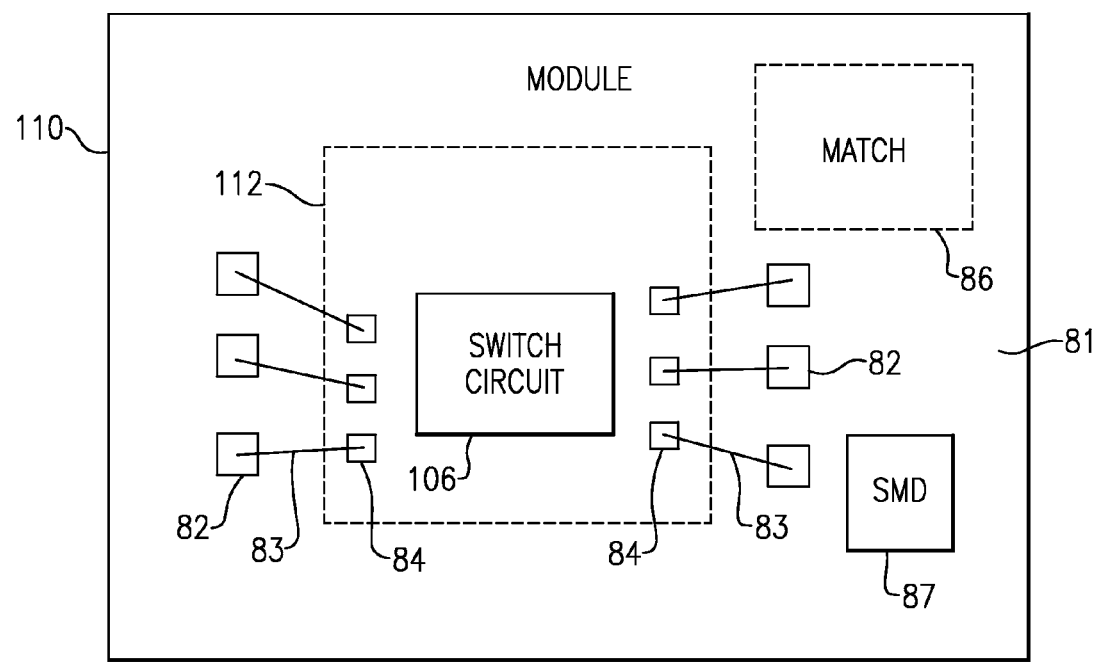
FIG. 2B shows a plan view of a more specific example of the switching module of FIG. 2A.
Figure 2C:
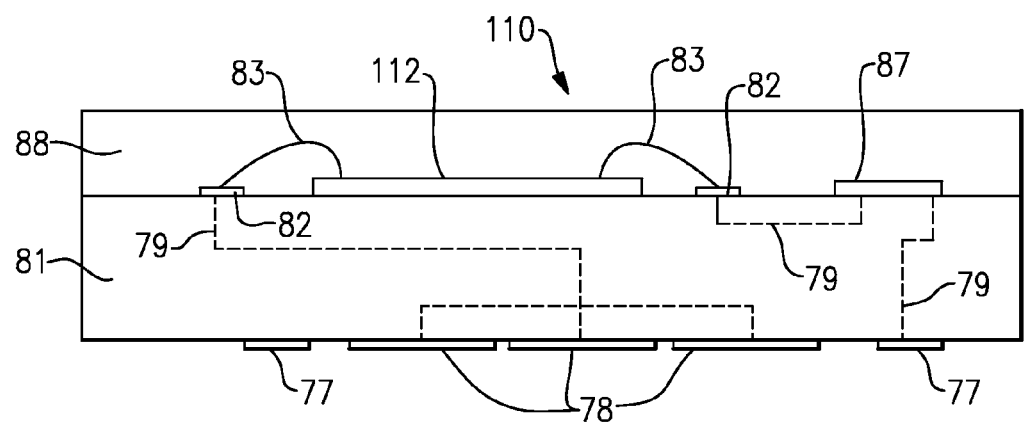
FIG. 2C shows a side view of the switching module of FIG. 2B.

FIGS. 2B and 2C show a plan view and a side view of a module 110 that can be a more specific example of the module 110 of FIG. 2A. The example module 110 can include a packaging substrate 81 that is configured to receive a plurality of components. In some embodiments, such components can include a die 112 having one or more featured as described herein. For example, the die 112 can include a switch circuit 106 having one or more features described herein. A plurality of connection pads 84 can facilitate electrical connections such as wirebonds 83 to connection pads 82 on the substrate 81 to facilitate passing of various signals to and from the die 112.

In some embodiments, the components mounted on the packaging substrate 81 or formed on or in the packaging substrate 81 can further include, for example, one or more surface mount devices (SMDs) (e.g., 87) and one or more matching networks (e.g., 86). In some embodiments, the packaging substrate 81 can include a laminate substrate.

In some embodiments, the module 110 can also include one or more packaging structures to, for example, provide protection and facilitate easier handling of the module 110. Such a packaging structure can include an overmold 88 formed over the packaging substrate 81 and dimensioned to substantially encapsulate the various circuits and components thereon.

It will be understood that although the module 110 is described in the context of wirebond-based electrical connections, one or more features of the present disclosure can also be implemented in other packaging configurations, including flip-chip configurations.

Figure 3:
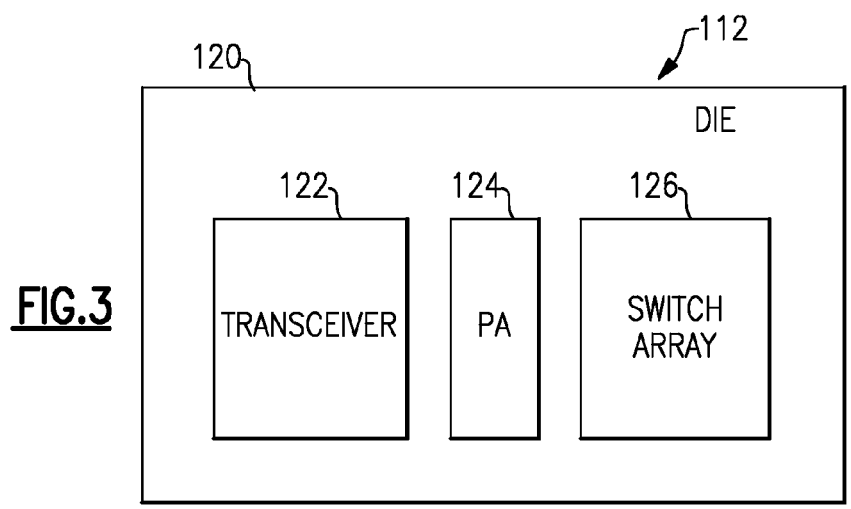
FIG. 3 schematically depicts a die having a switch array that can be configured to include one or more features of the present disclosure.

FIG. 3 shows that in some implementations, a die 120 (such as the die 112 of FIG. 2) can include one or more integrated circuits (ICs). For example, a transceiver 122 can be provided on the die 120, along with a power amplifier 124 and a switch array 126. Such functional components can be implemented as separate ICs, in a single IC, or some combination thereof. In some embodiments, the switch array 126 can include one or more FETs having one or more features as described herein.

Figure 4:
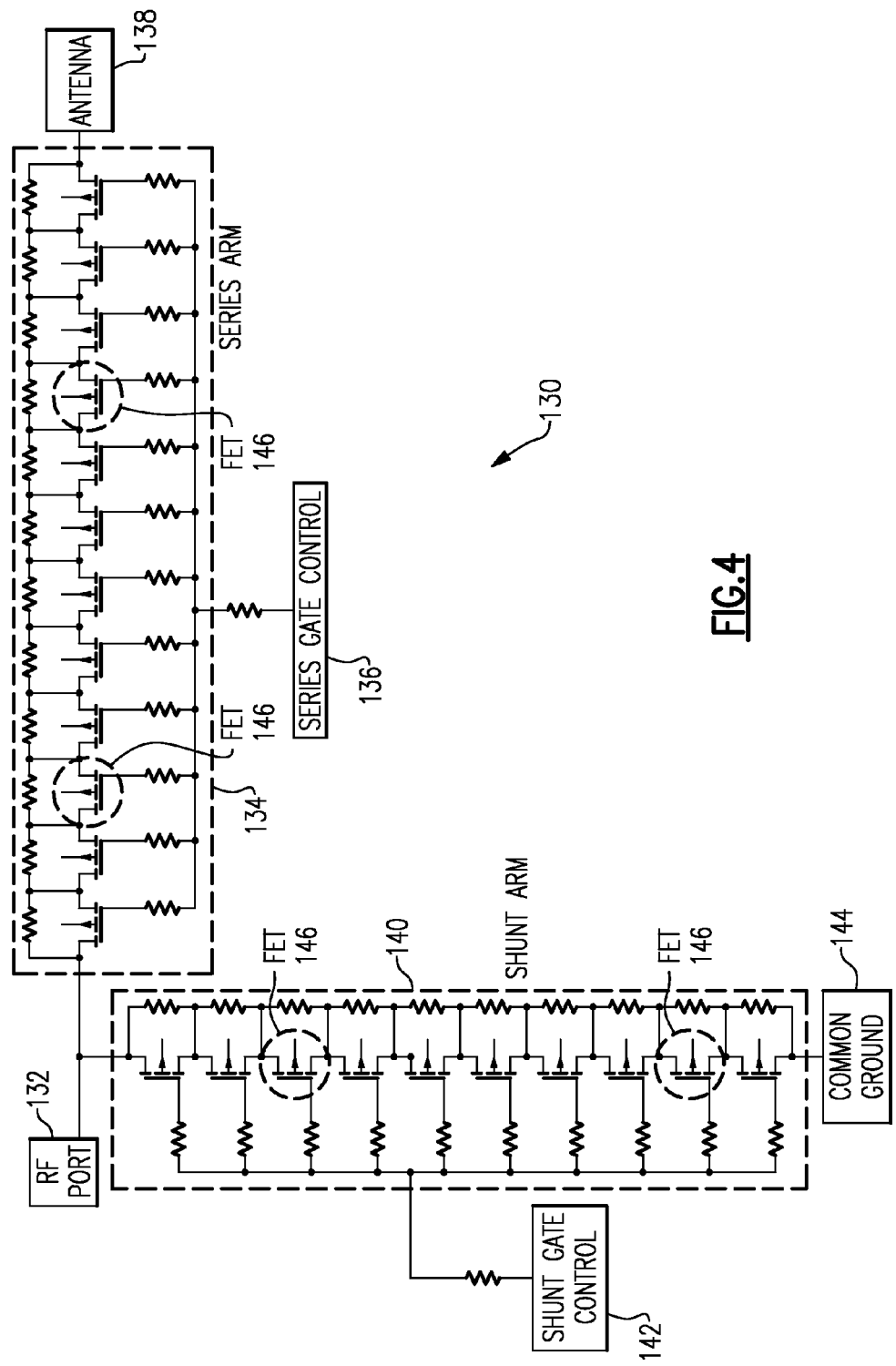
FIG. 4 shows an example of a switch array having a plurality of field effect transistors (FETs) along a given switch arm.

FIG. 4 schematically depicts an example of an RF transistor switching array 130 in which FETs having one or more features as described herein can be implemented. An array 134 of transistors 146 indicated as a series arm can be provided between an RF port 132 and an antenna port 138. In some embodiments, an array 140 of transistors 146 indicated as a shunt arm can also be provided between the RF port 132 and a common ground 144.

The RF port 132 can include a dedicated transmission (TX) port, a dedicated receive (RX) port, a transmit/receive (TRX) port, or a wide-band (WB) port. For the TX example, the RF port 132 can be connected to an output of a power amplifier. For the RX example, the RF port 132 can be connected to a filter which in turn can be connected to an ADC for baseband processing. For the TRX and WB examples, the RF port 132 can be connected to respective input(s) and output(s) for bidirectional passage of RF signals. The antenna port 138 can be connected to one or more antennas.

As shown in FIG. 4, a series gate control 136 and a shunt gate control 142 can be coupled to their respective arrays so as to provide control signals that either switch ON or OFF the series or shunt transistor stacks, respectively. When the RF port 132 is to be connected to the antenna port 138, a series gate control signal can be asserted, and a shunt gate control signal can be de-asserted. On the other hand, when it is desirable to close the RF port 132 from the antenna port 138 and provide electrical isolation, the series gate control signal can be de-asserted, and the shunt gate control signal can be asserted. The presence of such a shunt arm and the shunt gate control can be optional for an RF switch, and can provide greater isolation when the RF switch is in an OFF state.

In the example RF transistor switching array 130 of FIG. 4, resistors can be provided between the transistors 146 and the gate control (136 or 142) so as to provide isolation between relatively high RF voltages found at the transistors 146 and relatively low voltage control logic or level shifters that drive the switch arms. In some embodiments, additional RC filtering can be provided in the control circuitry so as to further knock down high RF voltages.

In the example RF transistor switching array 130 of FIG. 4, the body connection in each transistor switch is depicted as being unconnected. Such a body connection can be configured in a number of ways, including, for example, a floating body, a dynamic (active) bias, and a diode bias.

Figure 5:
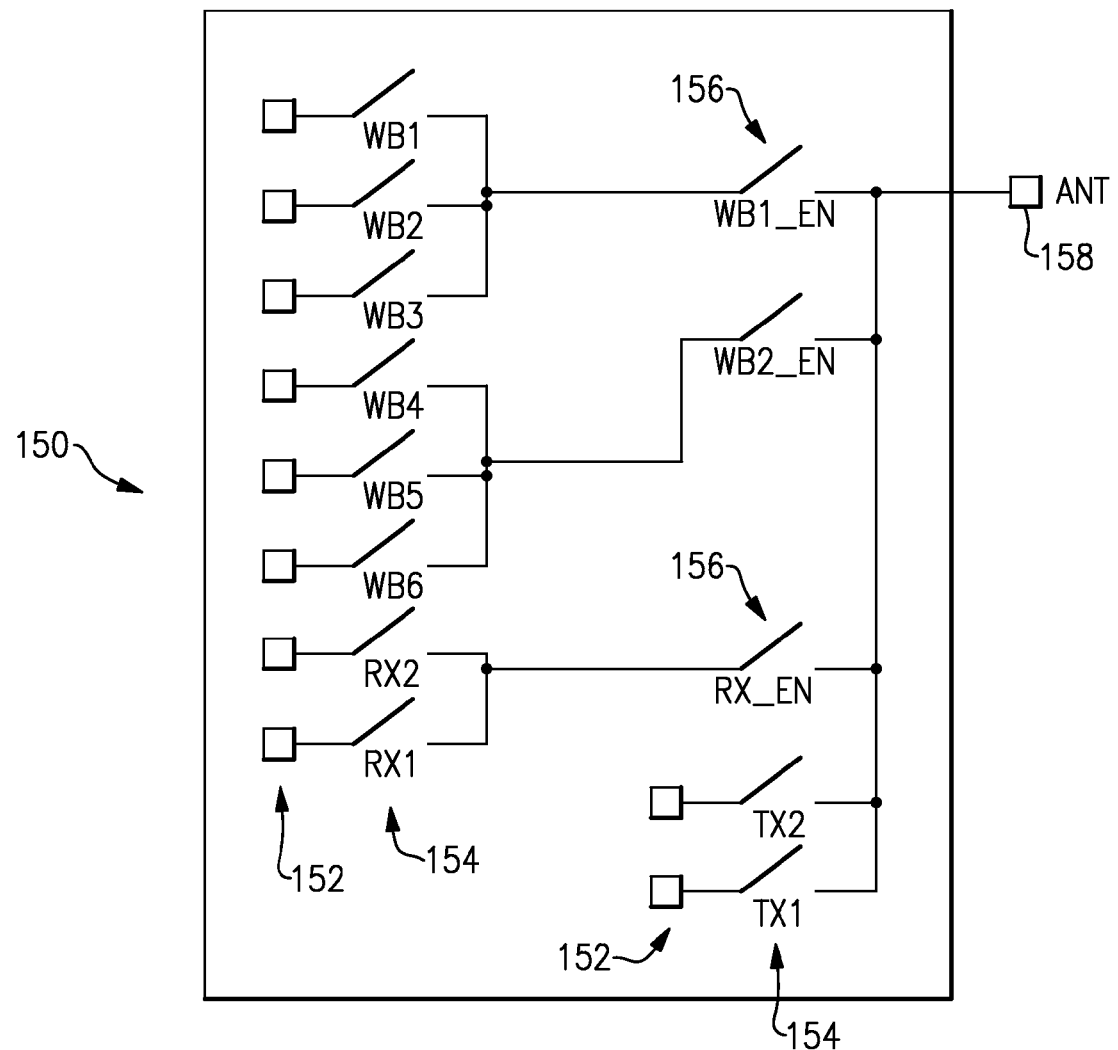
FIG. 5 shows that in some implementations, RF switches having one or more features of the present disclosure can be in a N-pole-M-throw configuration.

In the example configuration of FIG. 4, the FET devices are arranged in series. In some implementations, FET devices having one or more features as described herein can be arranged in other configurations. For example, such FET devices can be implemented in an N-pole-M-throw switch. FIG. 5 shows an example 150 of such a switch having a single pole (e.g., for an antenna port 158) and ten throws (e.g., for TX, RX and wide-band channels 152). For such an example with ten channels, switches 154 (indicated as WB1, WB2, WB3, WB4, WB5, WB6, RX2, RX1, TX2 and TX1) can include FETs. In the example shown, the wide-band channels and the RX channels can be provided with additional enable switches 156 so as to provide improved isolation between channels. Such additional enable switches can also include FETs.

As described in reference to FIGS. 4 and 5, switching of RF signals can involve many FET-based switches. In the context of SOI (silicon-on-insulator) process technology, FET devices can provide advantages such as improved isolation between adjacent devices due to an insulator below each device. Such improved isolation can result in, for example, lower parasitic capacitance which can improve power consumption at a given performance level, as well as resistance to latchup. Accordingly, SOI transistors are finding more and more applications as high-frequency RF switches.

In the context of SOI devices where breakdown voltages can be relatively low, a switching device can include a plurality of SOI FET switches arranged in series to provide a functionality of a single RF switch by voltage-dividing an RF signal. Such a configuration can allow switching of high power RF signals or switching under high VSWR (voltage standing wave ratio) conditions. Accordingly, the number of SOI FET devices can increase.

Figure 6A:
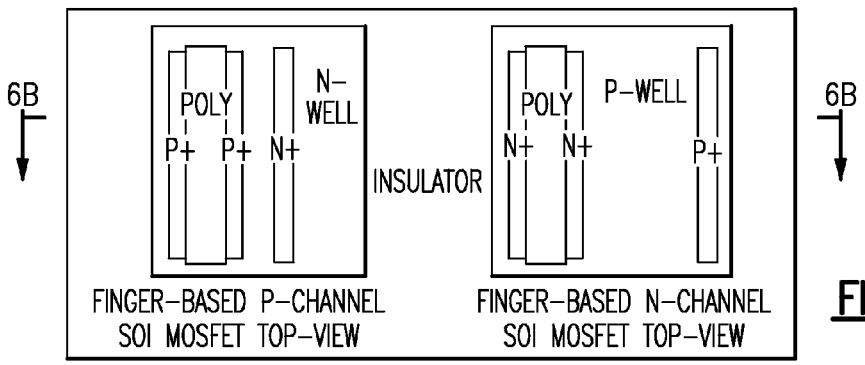
FIGS. 6A and 6B show plan and sectional views of an example silicon-on-insulator (SOI) metal-oxide-semiconductor FET (MOSFET) device having a finger configuration.
Figure 6B:
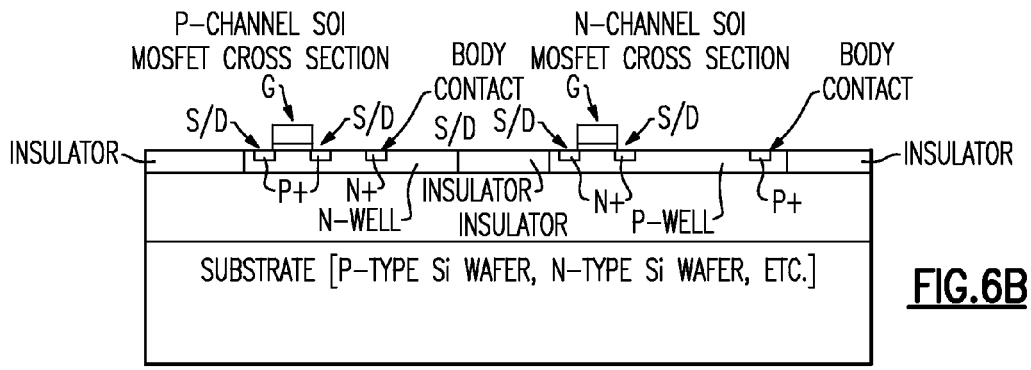

In some SOI FET configurations, each transistor can be configured as a finger-based device where source and drain are rectangular shaped (in a plan view) and a gate structure extends between the source and the drain like a rectangular shaped finger. FIGS. 6A and 6B show plan and side sectional views of an example finger-based FET device implemented as an SOI configuration. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 6A and 6B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source (S) and drain (D) are shown to be p-doped regions whose exposed surfaces generally define rectangles. As shown, S/D regions can be configured so that source and drain functionalities are reversed.

FIGS. 6A and 6B further show that a gate (G) can be formed on the n-well so as to be positioned between the source and the drain. The gate is depicted as having a rectangular shape that extends along with the source and the drain. Also shown is an n-type body contact. Formations of the rectangular shaped well, source and drain regions, and the body contact can be achieved by a number of known techniques. Further, operation of such MOSFET devices can be performed in a number of known manners.

Figure 7A:
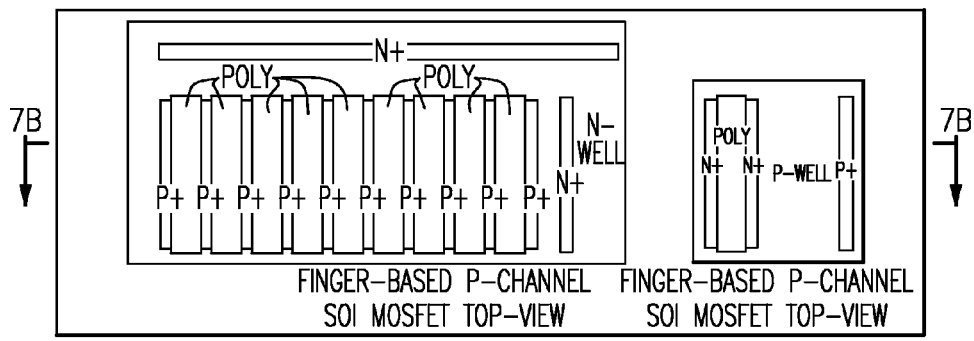
FIGS. 7A and 7B show plan and sectional views of an example array of SOI MOSFET devices having a multiple-finger configuration.
Figure 7B:
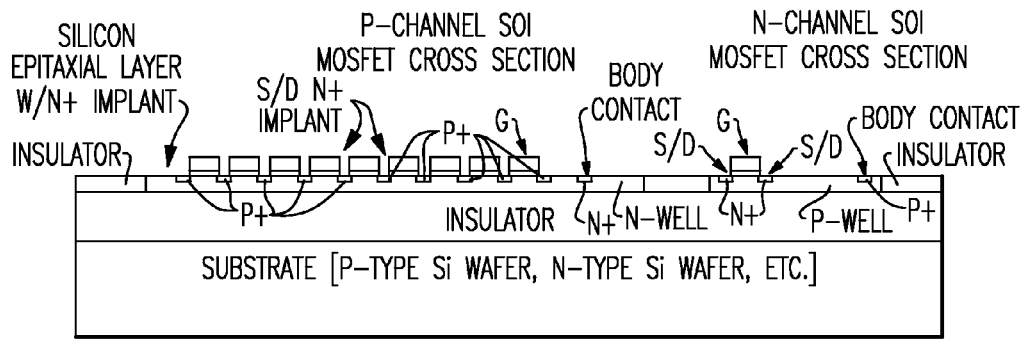

FIGS. 7A and 7B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 6A and 6B.

The example multiple-finger FET device of FIGS. 7A and 7B can be made to operate such that a drain of one FET acts as a source of its neighboring FET. Thus, the multiple-finger FET device as a whole can provide the voltage-dividing functionality described in reference to FIG. 4. For example, an RF signal can be provided at one of the outermost p-doped regions (e.g., the leftmost p-doped region); and as the signal passes through the series of FETs, the signal's voltage can be divided among the FETs. In such an example, the rightmost p-doped region can act as an overall drain of the multi-finger FET device.

The example rectangular shaped configurations of FIGS. 6 and 7 typically yield a relatively high Rds-on (resistance in the linear operating region) for a given area associated with the device. To reduce Rds-on, a FET device can be made to be larger which in turn can undesirably increase the size of a die on which many such FET devices are formed. In the context of increased number of SOI FET devices, such an increase in sizes of the FET devices and the die are generally undesirable.

Disclosed herein are a number of non-limiting examples of how FET devices can be configured to provide advantageous features that include reduced Rds-on per area of FETs. Such a feature can also be expressed as a product of Rds-on and area of a FET.

Figure 8A:
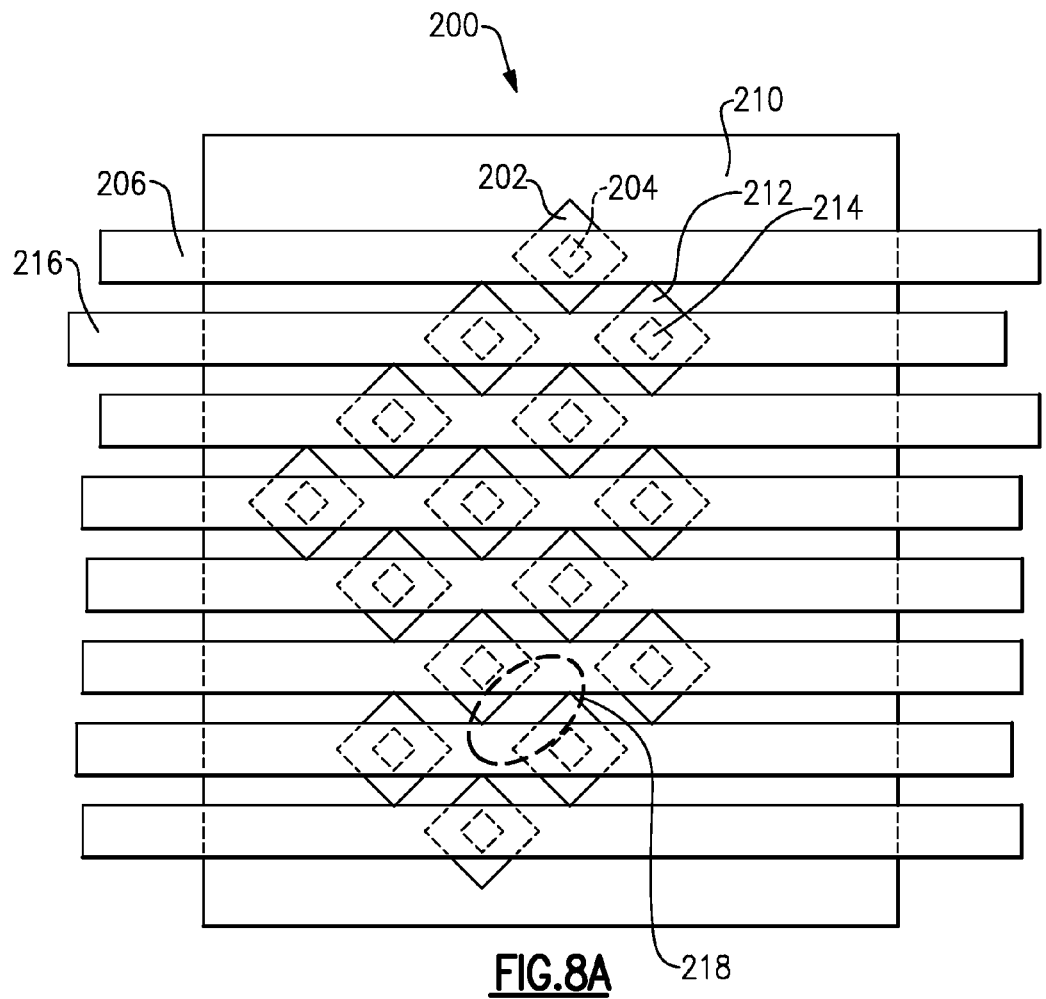
FIGS. 8A and 8B show an example array of diamond shaped FET devices arranged in a waffle configuration.

FIG. 8A shows a plan view of a configuration 200 where a plurality of implant/diffusion regions are indicated as 202 and 212. As described herein, such regions can be n-doped or p-doped. In the context of SOI process technology, such regions can be formed in a well (p-well or n-well) (not shown) which is formed on an insulator (not shown). In this example configuration, each of the diffusion regions 202, 212 has a right-angle rhombus shape (also referred to herein as a diamond shape) relative to the direction of conductors 206 and 216. The diamond shaped diffusion regions are arranged so that the sides of two neighboring regions face each other substantially squarely, resulting in a waffle like arrangement.

The example configuration 200 is shown to include a gate material 210 formed between the diffusion regions 202, 212. In this particular example, a single gate structure having openings for the diffusion regions 202, 212 can be provided to turn on or off flow of charge between the diffusion regions at the same time. Such a gate configuration can be implemented in, for example, the voltage-dividing series of transistors described in reference to FIG. 7. In other embodiments, different gates can be provided so as to allow separate control of groups of diffusion regions.

The example configuration 200 is shown to include an electrical contact structure 204, 214 on each of the diffusion regions 202, 212. Such a contact structure can include, for example, a pad and/or a via. The contact structures 204, 214 are shown to be electrically connected in groups by the conductors 206, 216.

In this particular example, the conductors 206, 216 are configured to extend along the X direction, diagonally through the opposing corners of the diamonds. In some embodiments, the example device 200 can be configured as a single FET device with every other conductor representing a source (or a drain) and the other conductors representing a drain (or a source) of the single FET device. In such an embodiment, a plurality of such source/drain regions can be connected in parallel. For example, if the first conductor 206 is a source, then all of the diffusion region(s) connected to it can act as source region(s). Then, the second conductor 216 and its connected diffusion regions can act as a drain. Thus, the third, fifth and seventh conductors and their respective diffusion regions can act as sources connected in parallel to the first conductor. Likewise, the fourth, sixth and eighth conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 200 can be configured so as to provide a plurality of cascading stages of transistors arranged in series. For example, if the first conductor 206 is a source, then all of the diffusion region(s) connected to it can act as source region(s). The second conductor 216 and its connected diffusion regions can act as a drain relative to the first conductor 206. Likewise, the second conductor 216 and the third conductor can act as source and drain, respectively, relative to each other. Such repeating source/drain configuration can continue as to yield a desired number of cascading stages of transistors that can be utilized as a series of RF switches.

In some implementations, the diamond shaped diffusion regions arranged in the waffle configuration can yield an RF switch having a reduced (Rds-on) (area) product when compared to a rectangular finger configuration. An example of such a reduction is described herein in greater detail.

FIG. 8A further shows that a given diamond shaped diffusion region includes a portion of its boundary that generally faces a neighboring diffusion region belonging to an adjacent source or drain. For example, an area 218 includes sides of two neighboring diffusion regions (belonging to respective source and drain groups) that generally face each other.

Figure 8B:
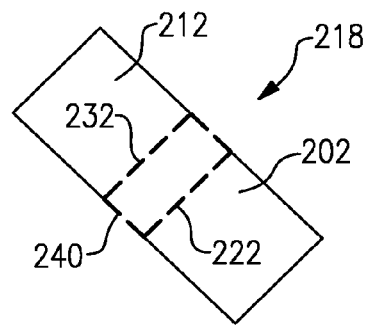

FIG. 8B shows an isolated view of such two neighboring diffusion regions. In this example, the two neighboring diffusion regions are indicated as 212 and 202. The diffusion region 212 includes a side 232 that generally faces a side 222 belonging to the diffusion region 202. In this particular example of the diamond shaped diffusion regions arranged in a waffle configuration, the two facing sides of neighboring diffusion regions are opposing sides of a rectangle.

As described herein, there are other shapes of diffusion regions and/or arrangements of such diffusion regions that can provide improved performance such as greater reductions in (Rds-on)(area) products. Various non-limiting examples described in reference to FIGS. 9-19 include various shaped implant diffusion regions that can be n-doped or p-doped. In the context of SOI process technology, such regions can be formed in a well (p-well or n-well) (not shown) which is formed on an insulator (not shown). In some implementations, such diffusion regions arranged in various configurations can yield RF switches having reduced (Rds-on)(area) products when compared to, for example, a rectangular finger configuration and/or a diamond/waffle configuration example of FIG. 8.

In the examples shown in FIGS. 9-19, a gate material is provided for each example configuration. Such a gate material is shown to be formed as a single structure between diffusion regions so as to allow turning on or off flow of charge between the diffusion regions at the same time. It will be understood that such a gate configuration can be implemented in, for example, the voltage-dividing series of transistors described in reference to FIG. 7. In other embodiments, different gates can be provided so as to allow separate control of groups of diffusion regions.

Figure 9:
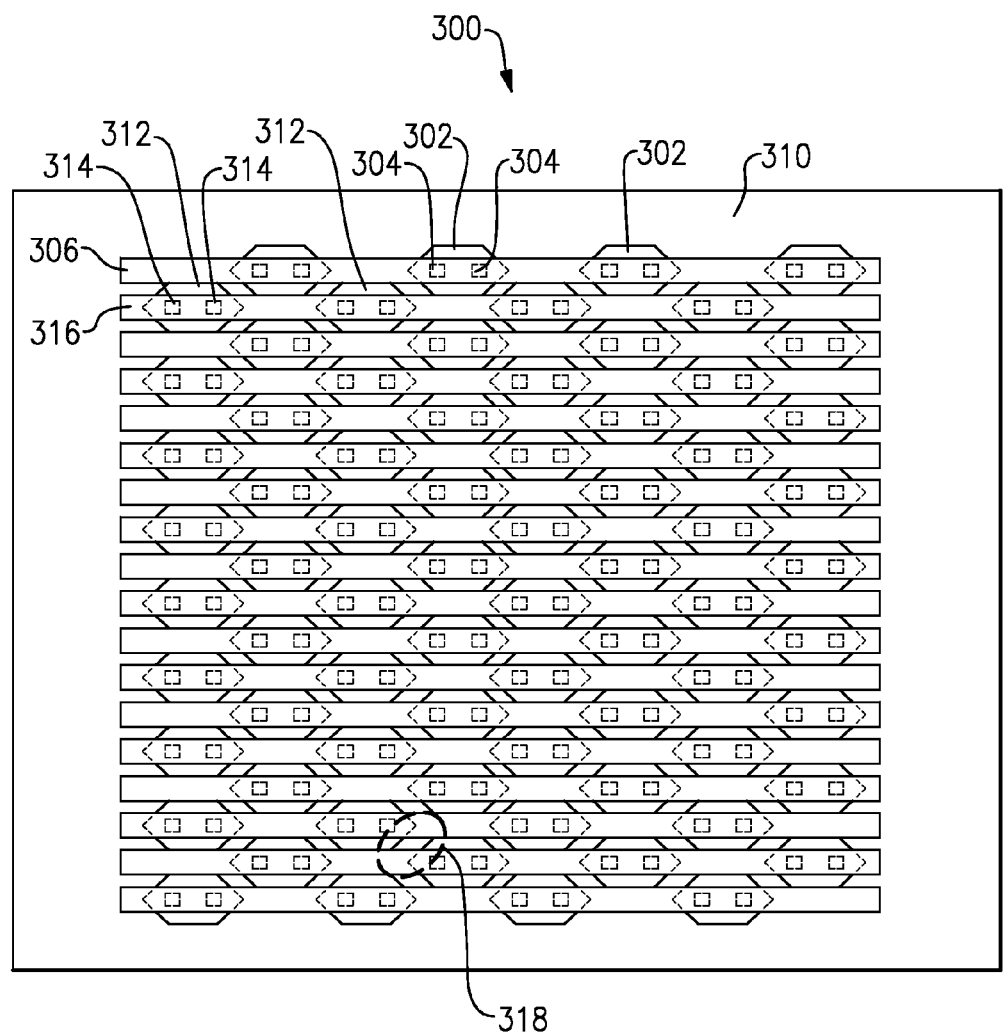
FIG. 9 shows an example array of hexagonal shaped FET devices.

FIG. 9 shows a plan view of a configuration 300 having a plurality of implant/diffusion regions indicated as 302 and 312. In this example configuration, each of the diffusion regions 302, 312 has a hexagonal shape. In some embodiments, such hexagonal shapes can be stretched along a direction of conductors 306 and 316. As shown, the hexagonal shaped diffusion regions can be arranged so that the sides of two neighboring regions face each other as indicated by 318. In this particular example, such facing-sides are depicted as being opposite sides of a non-rectangular parallelogram.

The example configuration 300 is shown to include a gate material 310 formed between the diffusion regions 302, 312.

Further, the example configuration 300 is shown to include electrical contact structures 304 on each of the diffusion regions 302, and electrical contact structures 314 on each of the diffusion regions 312. In other embodiments, each diffusion region can include greater or lesser number of such electrical contact structures. Such contact structures can include, for example, a pad and/or a via. The contact structures 304, 314 are shown to be electrically connected in groups by the conductors 306, 316.

In this particular example, the conductors 306, 316 are configured to extend along the X direction, along the elongation direction of the hexagonal shapes. In some embodiments, the example device 300 can be configured as a single FET device with every other conductor representing a source (or a drain) and the other conductors representing a drain (or a source) of the single FET device. In such an embodiment, a plurality of such source/drain regions can be connected in parallel. For example, if the first conductor 306 is a source, then all of the diffusion regions connected to it can act as source regions. Then, the second conductor 316 and its connected diffusion regions can act as a drain. Thus, the third, fifth and other odd-numbered conductors and their respective diffusion regions can act as sources connected in parallel to the first conductor. Likewise, the fourth, sixth and other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 300 can be configured so as to provide a plurality of cascading stages of transistors arranged in series. For example, if the first conductor 306 is a source, then all of the diffusion region(s) connected to it can act as source region(s). The second conductor 316 and its connected diffusion regions can act as a drain relative to the first conductor 306. Likewise, the second conductor 316 and the third conductor can act as source and drain, respectively, relative to each other. Such repeating source/drain configuration can continue as to yield a desired number of cascading stages of transistors that can be utilized as a series of RF switches.

Figure 10:
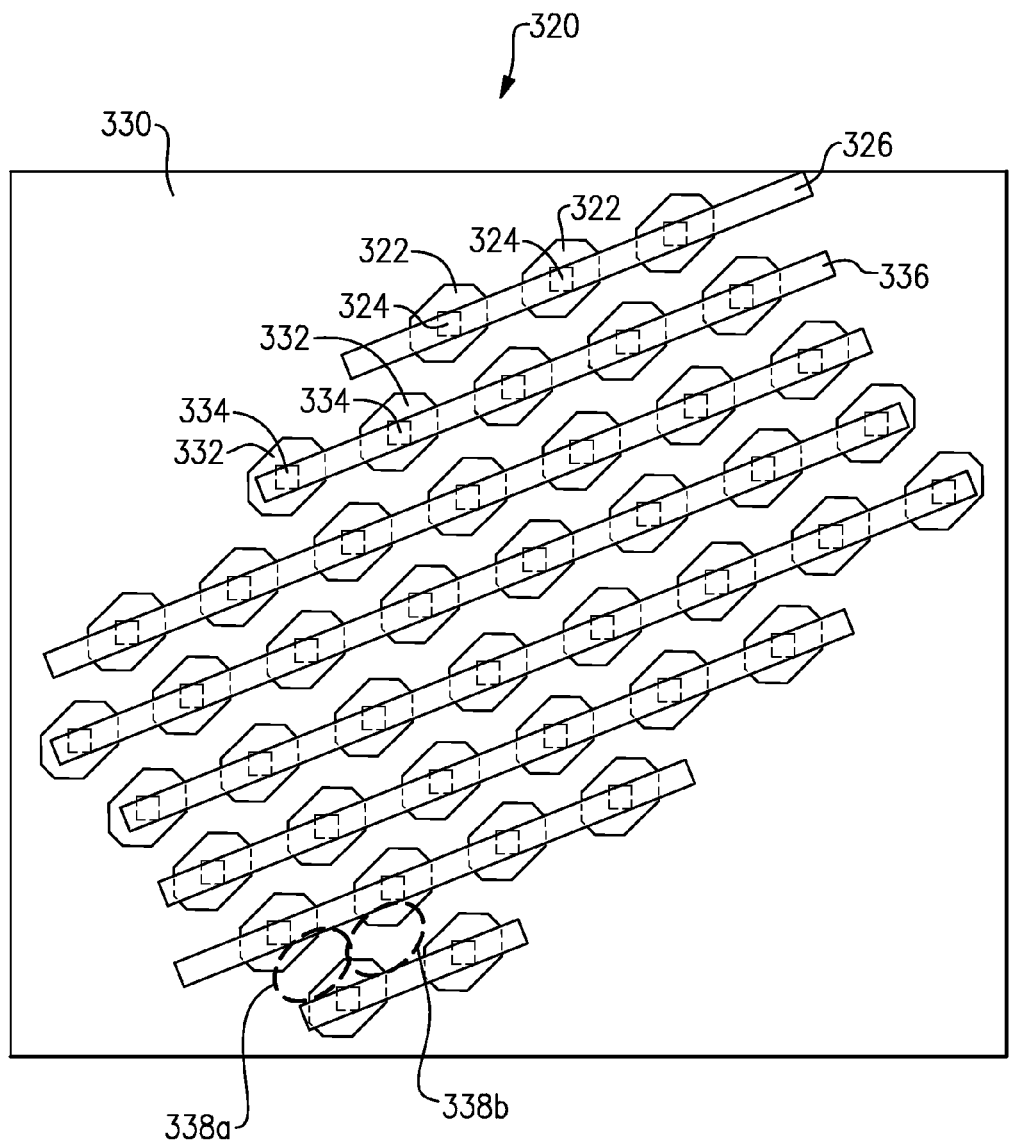
FIG. 10 shows an example array of octagonal shaped FET devices.

FIG. 10 shows a plan view of a configuration 320 having a plurality of implant/diffusion regions indicated as 322 and 332. In this example configuration, each of the diffusion regions 322, 332 has an octagonal shape. In some embodiments, such octagonal shapes can be stretched along a direction, and conductors 306 and 316 can extend along a direction that goes through opposing sides adjacent to the stretched sides of the octagonal shapes. As shown, the octagonal shaped diffusion regions can be arranged so that a given octagon includes two sides that face two different neighboring regions. Such facing arrangements are indicated as 338a and 338b. In this particular example, the facing sides of 338a are depicted as being opposite sides of a rectangle, and the facing sides of 338b are depicted as being opposite sides of a non-rectangular parallelogram.

The example configuration 320 is shown to include a gate material 330 formed between the diffusion regions 322, 332. Further, the example configuration 320 is shown to include an electrical contact structure 324, 334 on each of the diffusion regions 322, 332. In other embodiments, each diffusion region can include other number of such electrical contact structures. Such contact structures can include, for example, a pad and/or a via. The contact structures 324, 334 are shown to be electrically connected in groups by the conductors 326, 336.

In some embodiments, the example device 320 can be configured as a single FET device with every other conductor representing a source (or a drain) and the other conductors representing a drain (or a source) of the single FET device. In such an embodiment, a plurality of such source/drain regions can be connected in parallel. For example, if the first conductor 326 is a source, then all of the diffusion regions connected to it can act as source regions. Then, the second conductor 336 and its connected diffusion regions can act as a drain. Thus, the third, fifth and other odd-numbered conductors and their respective diffusion regions can act as sources connected in parallel to the first conductor. Likewise, the fourth, sixth and other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 320 can be configured so as to provide a plurality of cascading stages of transistors arranged in series. For example, if the first conductor 326 is a source, then all of the diffusion region(s) connected to it can act as source region(s). The second conductor 336 and its connected diffusion regions can act as a drain relative to the first conductor 326. Likewise, the second conductor 336 and the third conductor can act as source and drain, respectively, relative to each other. Such repeating source/drain configuration can continue as to yield a desired number of cascading stages of transistors that can be utilized as a series of RF switches.

Figure 11:
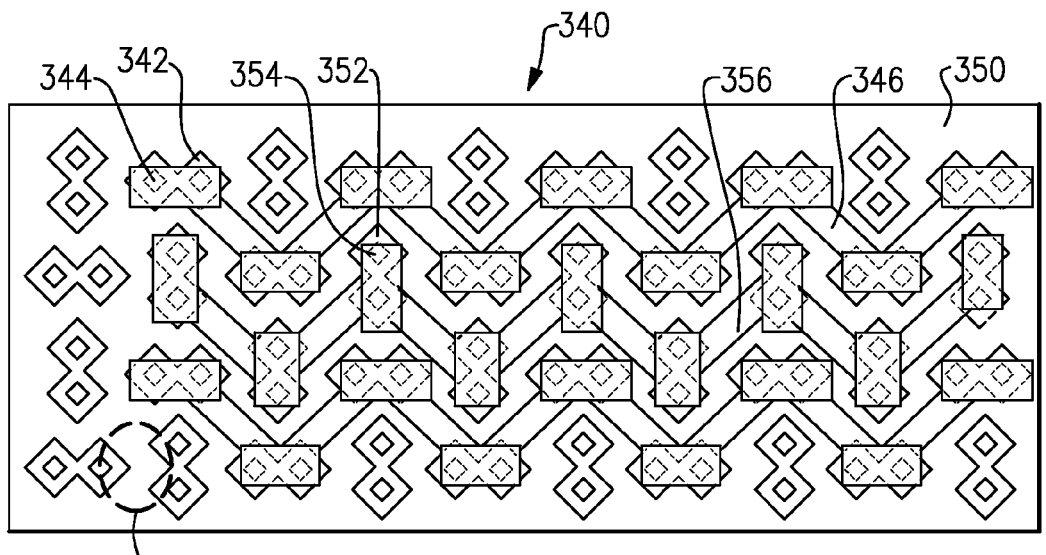
FIG. 11 shows an example array of double-diamond shaped FET devices.

FIG. 11 shows a plan view of a configuration 340 having a plurality of implant/diffusion regions indicated as 342 and 352. In this example configuration, each of the diffusion regions 342, 352 has a double-diamond shape that can be defined as two rhombus shapes with their corners overlapping. In some embodiments, such double-diamond shapes can be oriented along perpendicular directions in an alternating manner (e.g., along X and Y directions). For a pair of rows of such alternating orientations, one row is offset along the X direction so that the alternating orientations also exist along the Y direction. In the example shown, a conductor 346 connects X-direction-oriented double-diamond shapes among a pair of rows; and a conductor 356 connects Y-direction-oriented double-diamond shapes among a pair of rows. As shown, the double-diamond shaped diffusion regions are arranged so that a given pair of X-direction and Y-direction double-diamond shapes includes a facing area indicated as 358. In this particular example, the end corner and its adjacent sides of one double-diamond shape generally face a joining portion of the other double-diamond shape. Accordingly, the facing area can be generally defined as being "V" shaped.

The example configuration 340 is shown to include a gate material 350 formed between the diffusion regions 342, 352. Further, the example configuration 340 is shown to include an electrical contact structure 344, 354 on each of the two diamonds of the double-diamond shaped diffusion regions 342, 352. In other embodiments, each diffusion region can include other number of such electrical contact structures. Such contact structures can include, for example, a pad and/or a via. The contact structures 344, 354 are shown to be electrically connected in groups by the conductors 346, 356.

In some embodiments, the example device 340 can be configured as a single FET device with every other conductor representing a source (or a drain) and the other conductors representing a drain (or a source) of the single FET device. In such an embodiment, a plurality of such source/drain regions can be connected in parallel. For example, if the first conductor 346 is a source, then all of the diffusion regions connected to it can act as source regions. Then, the second conductor 356 and its connected diffusion regions can act as a drain. Thus, any other odd-numbered conductors and their respective diffusion regions can act as sources connected in parallel to the first conductor. Likewise, any other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 340 can be configured so as to provide a plurality of cascading stages of transistors arranged in series. For example, if the first conductor 346 is a source, then all of the diffusion region(s) connected to it can act as source region(s). The second conductor 356 and its connected diffusion regions can act as a drain relative to the first conductor 346. Likewise, the second conductor 356 and the third conductor can act as source and drain, respectively, relative to each other. Such repeating source/drain configuration can continue as to yield a desired number of cascading stages of transistors that can be utilized as a series of RF switches.

Figure 12:
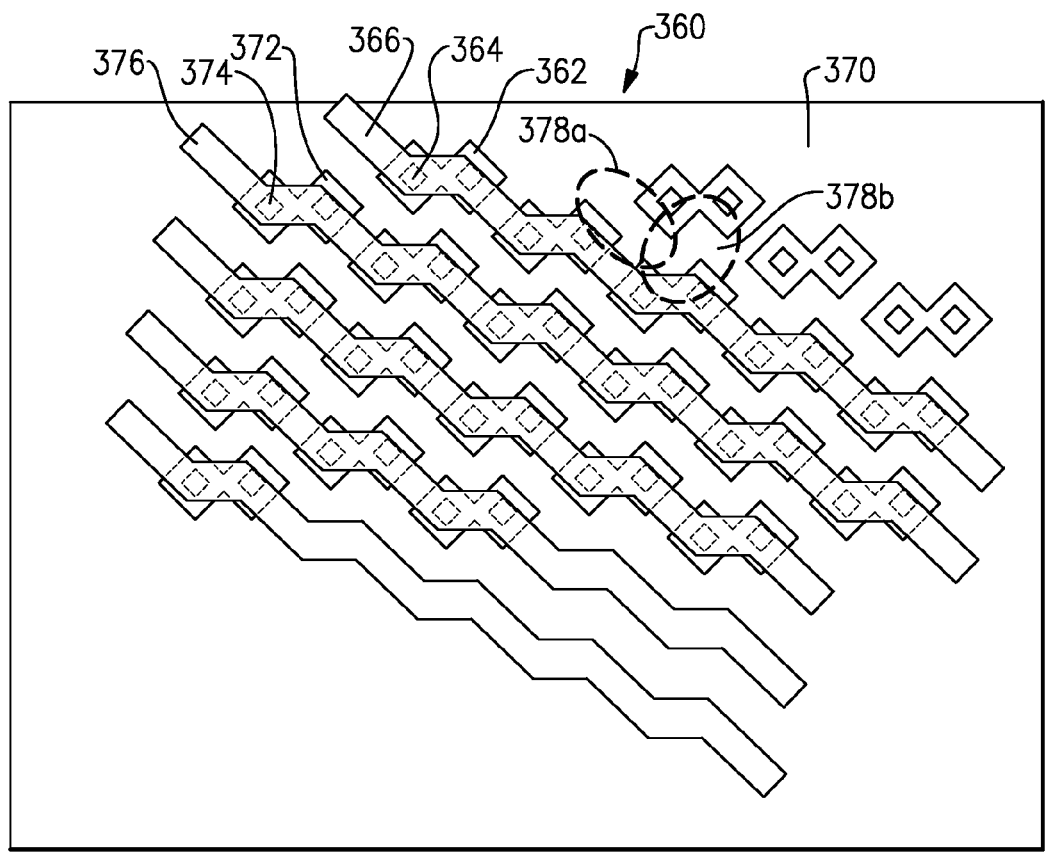
FIG. 12 shows an example of a variation of the array of FIG. 11.

FIG. 12 shows a plan view of a configuration 360 having a plurality of implant/diffusion regions indicated as 362 and 372. In this example configuration, each of the diffusion regions 362, 372 has a double-diamond shape similar to that of FIG. 11. In this example, however, such double-diamond shapes can be oriented so that for a group of connected diffusion regions, a lower side adjacent to an end corner of one region faces an upper side adjacent to an opposite end corner of the next diffusion region. For the next group of connected diffusion regions, such a pattern is repeated but offset so that a joining recessed corner of a diffusion region of the first group faces a protruding corner between the joining corner and the end corner of a diffusion region of the second group. Accordingly, the example arrangement yields facing areas that include those indicated as 378*a* and 378*b*. The facing area 378*a* can include end sides that are opposite sides of a non-rectangular parallelogram. The facing area 378*b* can include offset saw-teeth shaped sides of a pair of a pair of diffusion regions belonging to different groups, so as to yield a saw-teeth shaped facing area.

The example configuration 360 is shown to include a gate material 370 formed between the diffusion regions 362, 372. Further, the example configuration 360 is shown to include an electrical contact structure 364, 374 on each of the two diamonds of the double-diamond shaped diffusion regions 362, 372. In other embodiments, each diffusion region can include other number of such electrical contact structures. Such contact structures can include, for example, a pad and/or a via. The contact structures 364, 374 are shown to be electrically connected in groups by the conductors 366, 376.

In some embodiments, the example device 360 can be configured as a single FET device with every other conductor representing a source (or a drain) and the other conductors representing a drain (or a source) of the single FET device. In such an embodiment, a plurality of such source/drain regions can be connected in parallel. For example, if the first conductor 366 is a source, then all of the diffusion regions connected to it can act as source regions. Then, the second conductor 376 and its connected diffusion regions can act as a drain. Thus, any other odd-numbered conductors and their respective diffusion regions can act as sources connected in parallel to the first conductor. Likewise, any other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 360 can be configured so as to provide a plurality of cascading stages of transistors arranged in series. For example, if the first conductor 366 is a source, then all of the diffusion region(s) connected to it can act as source region(s). The second conductor 376 and its connected diffusion regions can act as a drain relative to the first conductor 366. Likewise, the second conductor 376 and the third conductor can act as source and drain, respectively, relative to each other. Such repeating source/drain configuration can continue as to yield a desired number of cascading stages of transistors that can be utilized as a series of RF switches.

Figure 13:
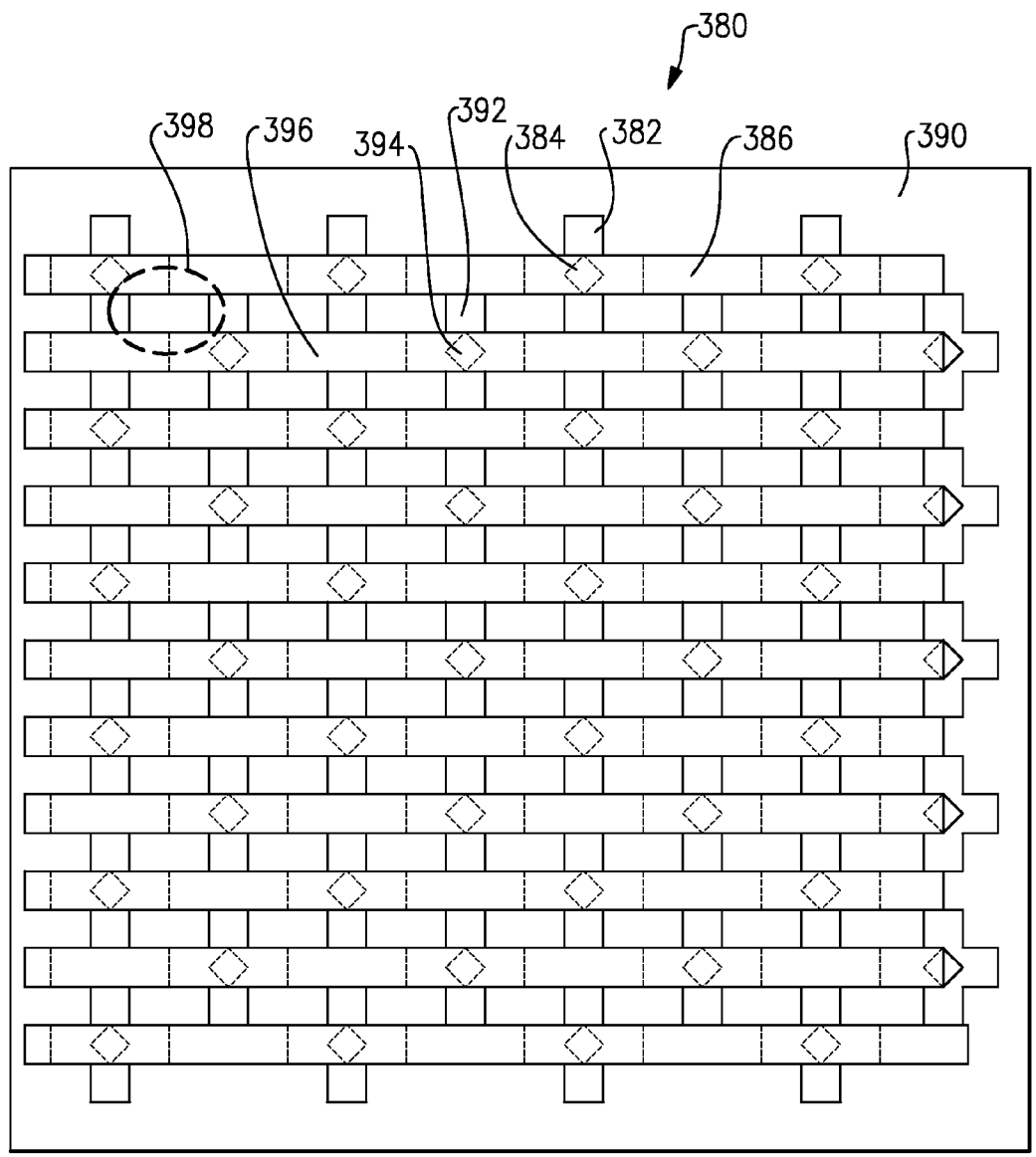
FIG. 13 shows an example array of cross shaped FET devices.

FIG. 13 shows a plan view of a configuration 380 having a plurality of implant/diffusion regions indicated as 382 and 392. In this example configuration, each of the diffusion regions 382, 392 has a cross shape. In some embodiments, such cross shapes can be oriented so that the perpendicular extensions are directed along X and Y directions. For a pair of groups of cross shaped diffusion regions along the X direction, one group is offset along the X direction so that a cross shape of one group is positioned about half-way (along the X direction) between two cross shapes of the other group. A pair of groups of cross shaped diffusions along the Y direction is offset in a similar manner. In the example shown, conductors 386 and 396 are shown to extend along the X directions. As shown, the cross shaped diffusion regions can be arranged so that two neighboring regions belonging to two groups face each other as indicated by 398. In this particular example, the lower right recessed corner (of one cross shape) and its adjacent sides are depicted as facing the upper left recessed corner (of the other cross shape) and its sides.

The example configuration 380 is shown to include a gate material 390 formed between the diffusion regions 382, 392. Further, the example configuration 380 is shown to include electrical contact structures 384, 394 on each of the diffusion regions 382, 392. In other embodiments, each diffusion region can include other numbers of such electrical contact structures. Such contact structures can include, for example, a pad and/or a via. The contact structures 384, 394 are shown to be electrically connected in groups by the conductors 386, 396.

In this particular example, the conductors 386, 396 are configured to extend along the X direction. In some embodiments, the example device 380 can be configured as a single FET device with every other conductor representing a source (or a drain) and the other conductors representing a drain (or a source) of the single FET device. In such an embodiment, a plurality of such source/drain regions can be connected in parallel. For example, if the first conductor 386 is a source, then all of the diffusion regions connected to it can act as source regions. Then, the second conductor 396 and its connected diffusion regions can act as a drain. Thus, any other odd-numbered conductors and their respective diffusion regions can act as sources connected in parallel to the first conductor. Likewise, any other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 380 can be configured so as to provide a plurality of cascading stages of transistors arranged in series. For example, if the first conductor 386 is a source, then all of the diffusion region(s) connected to it can act as source region(s). The second conductor 396 and its connected diffusion regions can act as a drain relative to the first conductor 386. Likewise, the second conductor 396 and the third conductor can act as source and drain, respectively, relative to each other. Such repeating source/drain configuration can continue as to yield a desired number of cascading stages of transistors that can be utilized as a series of RF switches.

Figure 14:
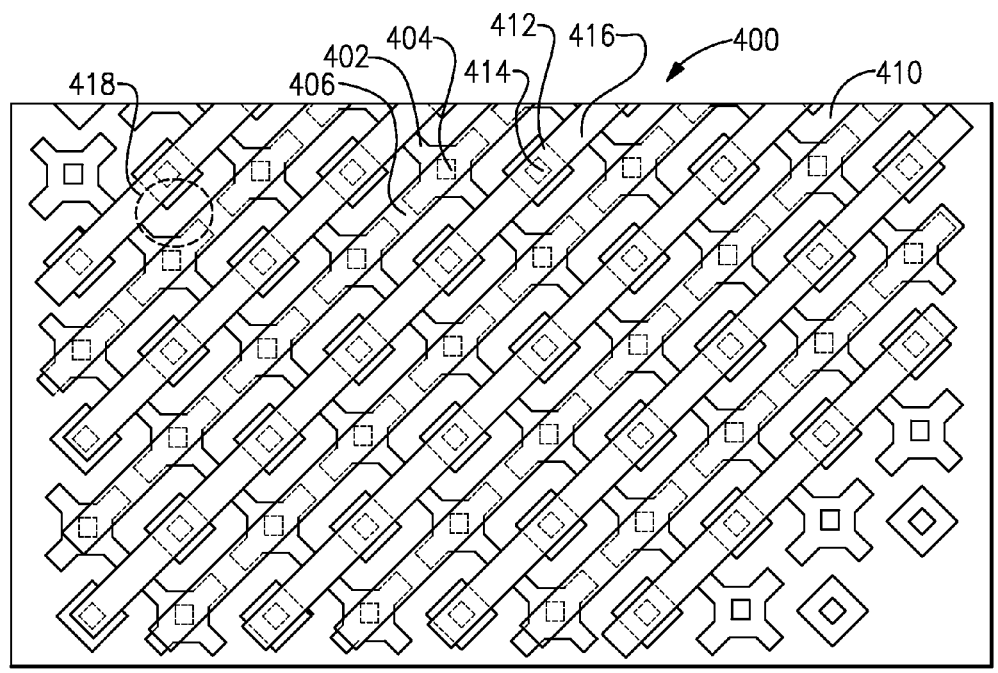
FIG. 14 shows an example array of cross shaped FET devices and diamond shaped FET devices.
Figure 15:
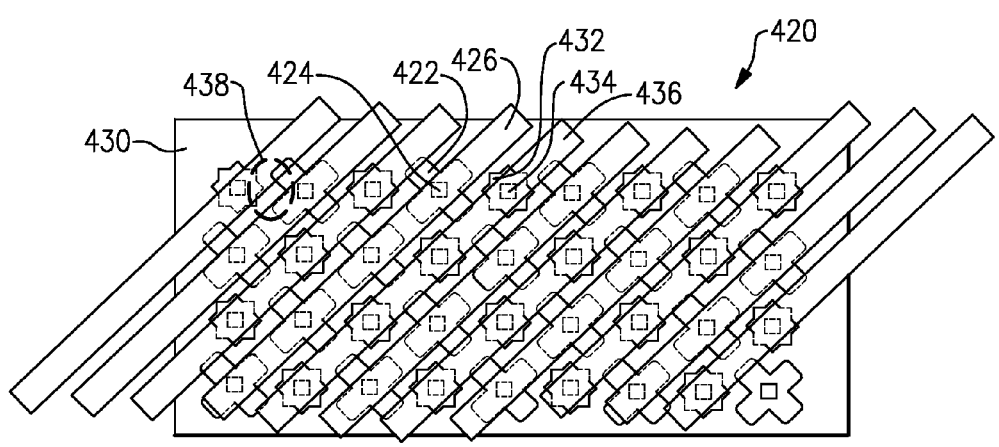
FIG. 15 shows an example array of cross shaped FET devices and star shaped FET devices.

FIGS. 14 and 15 show that in some implementations, first and second groups of diffusion regions corresponding to source and drain do not need to have same shapes.

FIG. 14 shows a plan view of a configuration 400 having a plurality of implant/diffusion regions 402, and a plurality of implant/diffusion regions 412 having a different shape as that of the regions 402. In this example configuration, each of the diffusion regions 402 has a shape that can be defined by an outline resulting from a combination of a cross and a commonly centered rhombus whose opposing corners extend along the extensions of the cross. Further, each of the diffusion regions 412 has rectangular shape (e.g., a square) having sides that extend along the perpendicular directions of the extensions of the cross. In this example configuration, the square regions 412 are offset about half-way between the centers of the crosses 402, such that a given square is approximately at a center of four neighboring crosses 402. In the example shown, conductors 406 are shown to extend through the crosses 402 in a direction along one of the two perpendicular directions associated with the extensions of the crosses 402; and conductors 416 are shown to extend through the square regions 412 in a direction generally parallel to that of the conductors 406. As shown, the cross shaped and square diffusion regions can be arranged so that two neighboring regions belonging to two groups face each other as indicated by 418. In this particular example, the inner portion of upper extensions of the cross shape 402 are depicted as facing the two lower adjacent sides of the square shape 412, so as to generally define a "V" shaped facing area.

The example configuration 400 is shown to include a gate material 410 formed between the diffusion regions 402, 412. Further, the example configuration 400 is shown to include electrical contact structures 404, 414 on each of the respective diffusion regions 402, 412. In other embodiments, each diffusion region can include other numbers of such electrical contact structures. Such contact structures can include, for example, a pad and/or a via. The contact structures 404, 414 are shown to be electrically connected in groups by the conductors 406, 416.

In some embodiments, the example device 400 can be configured as a single FET device with every other conductor representing a source (or a drain) and the other conductors representing a drain (or a source) of the single FET device. In such an embodiment, a plurality of such source/drain regions can be connected in parallel. For example, if the first conductor 406 is a source, then all of the diffusion regions connected to it can act as source regions. Then, the second conductor 416 and its connected diffusion regions can act as a drain. Thus, any other odd-numbered conductors and their respective diffusion regions can act as sources connected in parallel to the first conductor. Likewise, any other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 400 can be configured so as to provide a plurality of cascading stages of transistors arranged in series. For example, if the first conductor 406 is a source, then all of the diffusion region(s) connected to it can act as source region(s). The second conductor 416 and its connected diffusion regions can act as a drain relative to the first conductor 406. Likewise, the second conductor 416 and the third conductor can act as source and drain, respectively, relative to each other. Such repeating source/drain configuration can continue as to yield a desired number of cascading stages of transistors that can be utilized as a series of RF switches.

FIG. 15 shows a plan view of a configuration 420 that is similar to the example configuration 400 of FIG. 14. Implant/diffusion regions 422 have a cross shape that does not include the rhombus shaped center, but does include beveled corners at the ends of the extensions. Implant/diffusion regions 432 have a star shape that can be defined by an outline resulting from two co-centered squares, where one is rotated by about 45 degrees. The arrangement of the diffusion regions 422 and 432 is similar to the example of FIG. 14. As shown, the cross shaped and star shaped diffusion regions can be arranged so that two neighboring regions belonging to two groups face each other as indicated by 438. In this particular example, the inner portion of left extensions of the cross shape 422 are depicted as facing the right corner and adjacent sides of the star shape 432.

The example configuration 420 is shown to include a gate material 430 formed between the diffusion regions 422, 432. Further, the example configuration 420 is shown to include electrical contact structures 424, 434 on each of the respective diffusion regions 422, 432. In other embodiments, each diffusion region can include other numbers of such electrical contact structures. Such contact structures can include, for example, a pad and/or a via. The contact structures 424, 434 are shown to be electrically connected in groups by the conductors 426, 436.

In some embodiments, the example device 420 can be configured as a single FET device with every other conductor representing a source (or a drain) and the other conductors representing a drain (or a source) of the single FET device. In such an embodiment, a plurality of such source/drain regions can be connected in parallel. For example, if the first conductor 426 is a source, then all of the diffusion regions connected to it can act as source regions. Then, the second conductor 436 and its connected diffusion regions can act as a drain. Thus, any other odd-numbered conductors and their respective diffusion regions can act as sources connected in parallel to the first conductor. Likewise, any other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 420 can be configured so as to provide a plurality of cascading stages of transistors arranged in series. For example, if the first conductor 426 is a source, then all of the diffusion region(s) connected to it can act as source region(s). The second conductor 436 and its connected diffusion regions can act as a drain relative to the first conductor 426. Likewise, the second conductor 436 and the third conductor can act as source and drain, respectively, relative to each other. Such repeating source/drain configuration can continue as to yield a desired number of cascading stages of transistors that can be utilized as a series of RF switches.

Figure 16:
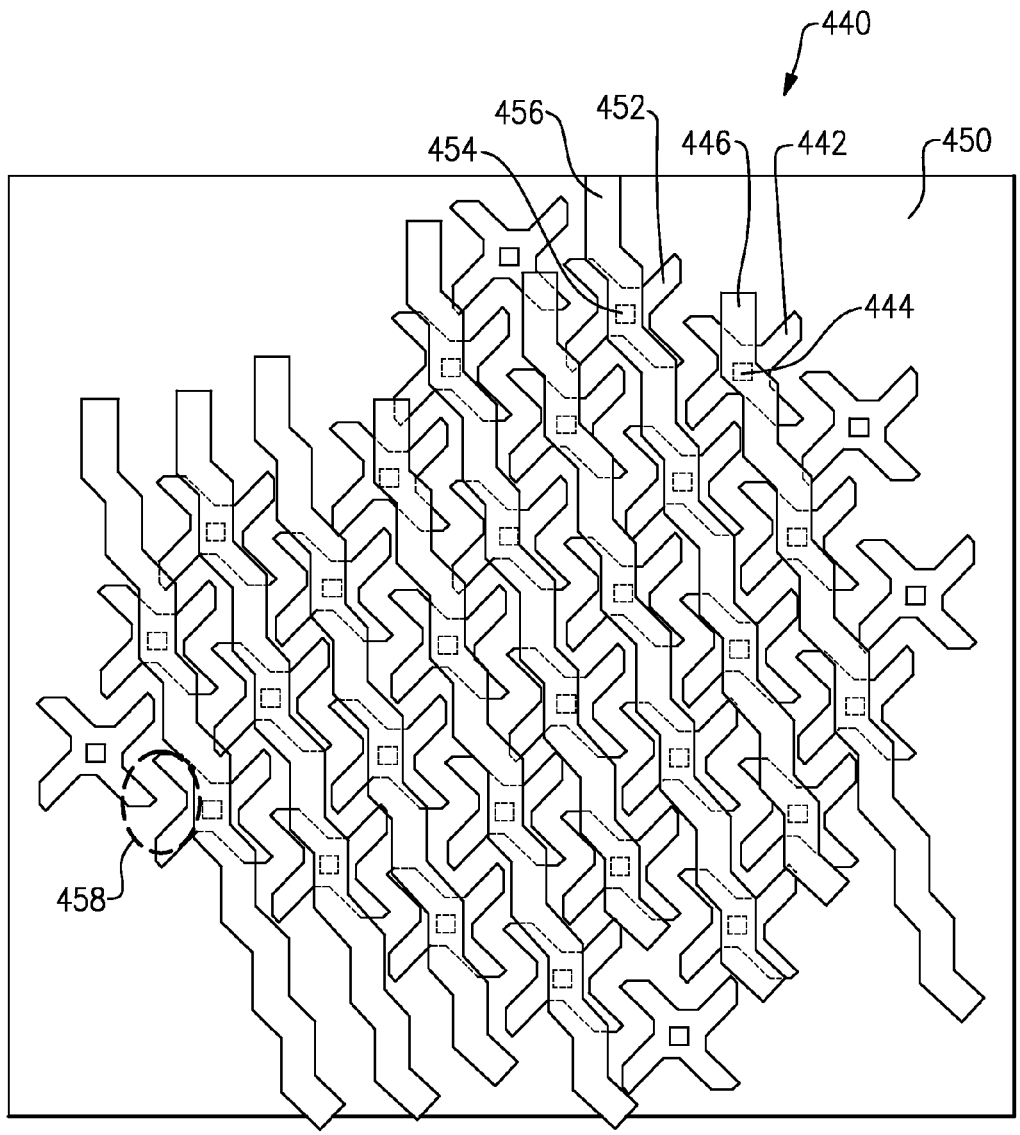
FIG. 16 show an example array of modified-star shaped FET devices.

FIG. 16 shows a plan view of a configuration 440 where implant/diffusion regions 442, 452 have a modified cross shape. Each of the four extensions of the cross shape is shown to be offset from the perpendicular center lines towards the clockwise side. Further the clockwise-side corner at the end of each extension is shown to include a bevel. As shown, the diffusion regions 442 are arranged along a general direction of extension of conductors 446 that forms an angle of about 45 degrees relative to two parallel extension of the cross shape. The diffusions regions 452 are arranged and oriented similarly; and are offset from the diffusion regions 442 so as to provide staggered centers of the two groups of regions 442, 452. As shown, the modified cross shaped diffusion regions can be arranged so that two neighboring regions belonging to two groups face each other as indicated by 458. In this particular example, edges associated with one extension of one cross is depicted as facing a recessed portion defined by two adjacent extension of the neighboring cross.

The example configuration 440 is shown to include a gate material 450 formed between the diffusion regions 442, 452. Further, the example configuration 440 is shown to include electrical contact structures 444, 454 on each of the respective diffusion regions 442, 452. In other embodiments, each diffusion region can include other numbers of such electrical contact structures. Such contact structures can include, for example, a pad and/or a via. The contact structures 444, 454 are shown to be electrically connected in groups by the conductors 446, 456.

In some embodiments, the example device 440 can be configured as a single FET device with every other conductor representing a source (or a drain) and the other conductors representing a drain (or a source) of the single FET device. In such an embodiment, a plurality of such source/drain regions can be connected in parallel. For example, if the first conductor 446 is a source, then all of the diffusion regions connected to it can act as source regions. Then, the second conductor 456 and its connected diffusion regions can act as a drain. Thus, any other odd-numbered conductors and their respective diffusion regions can act as sources connected in parallel to the first conductor. Likewise, any other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 440 can be configured so as to provide a plurality of cascading stages of transistors arranged in series. For example, if the first conductor 446 is a source, then all of the diffusion region(s) connected to it can act as source region(s). The second conductor 456 and its connected diffusion regions can act as a drain relative to the first conductor 446. Likewise, the second conductor 456 and the third conductor can act as source and drain, respectively, relative to each other. Such repeating source/drain configuration can continue as to yield a desired number of cascading stages of transistors that can be utilized as a series of RF switches.

Figure 17:
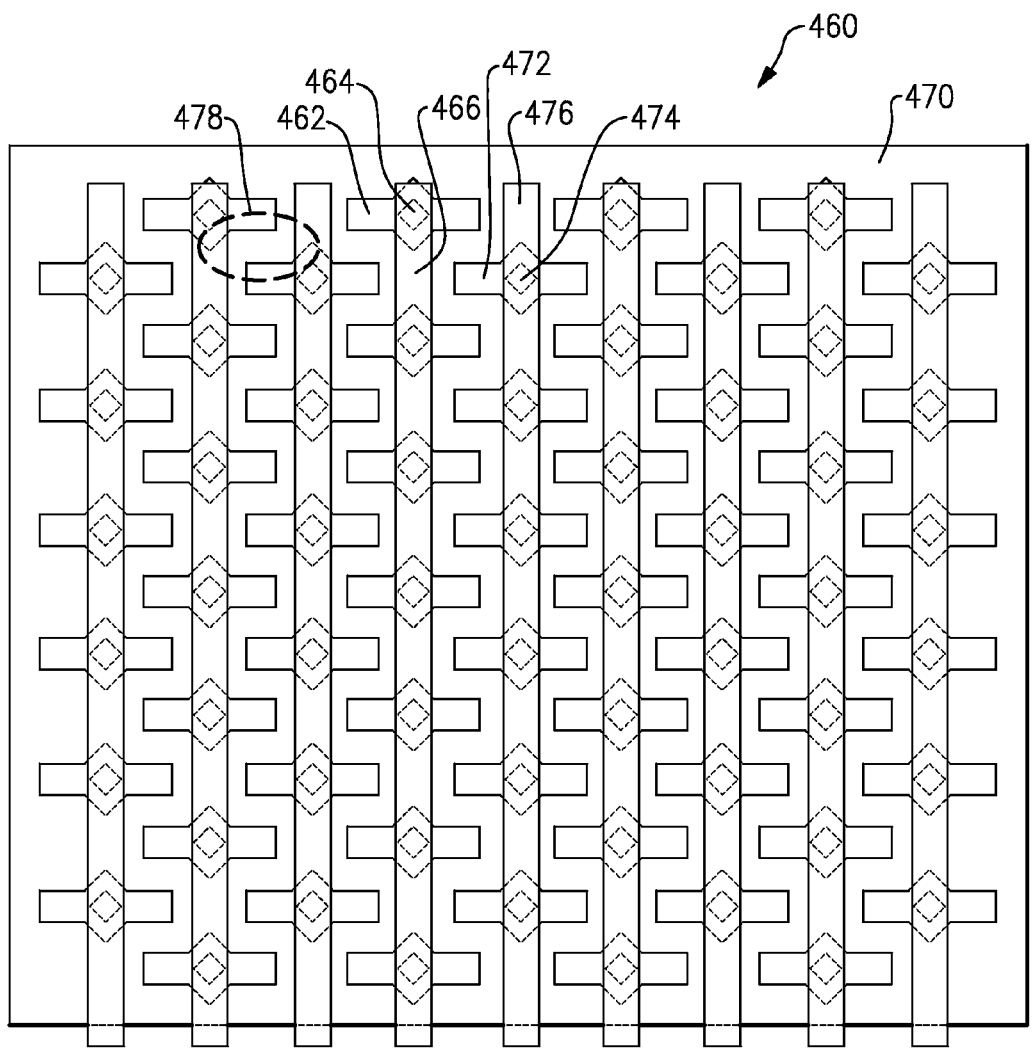
FIG. 17 shows an example array of FET devices having a combination of rectangle and diamond shapes.

FIG. 17 shows a plan view of a configuration 460 where implant/diffusion regions 462, 472 include a shape that can be defined by an outline of a rectangle and a generally co-centered rhombus. The rhombus is oriented so that its two opposing corners are along the length direction of the rectangle. As shown, the diffusion regions 462, 472 are arranged so that the rectangles' length direction is along X direction. Conductors 466 and 476 are shown to extend along Y direction so as to connect centers of their respective diffusion regions. The diffusions regions 462 and the diffusion regions 472 are offset from each other so as to be staggered with each other along both X and Y directions. As shown, the diffusion regions can be arranged so that two neighboring regions belonging to two groups face each other as indicated by 478. In this particular example, upper left edge of the rectangle and the upper left edge of the rhombus of one region are shown to face the lower right edge of the rectangle and the lower right edge of the rhombus of the other region.

The example configuration 460 is shown to include a gate material 470 formed between the diffusion regions 462, 472. Further, the example configuration 460 is shown to include electrical contact structures 464, 474 on each of the respective diffusion regions 462, 472. In other embodiments, each diffusion region can include other numbers of such electrical contact structures. Such contact structures can include, for example, a pad and/or a via. The contact structures 464, 474 are shown to be electrically connected in groups by the conductors 466, 476.

In some embodiments, the example device 460 can be configured as a single FET device with every other conductor representing a source (or a drain) and the other conductors representing a drain (or a source) of the single FET device. In such an embodiment, a plurality of such source/drain regions can be connected in parallel. For example, if the first conductor 466 is a source, then all of the diffusion regions connected to it can act as source regions. Then, the second conductor 476 and its connected diffusion regions can act as a drain. Thus, any other odd-numbered conductors and their respective diffusion regions can act as sources connected in parallel to the first conductor. Likewise, any other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 460 can be configured so as to provide a plurality of cascading stages of transistors arranged in series. For example, if the first conductor 466 is a source, then all of the diffusion region(s) connected to it can act as source region(s). The second conductor 476 and its connected diffusion regions can act as a drain relative to the first conductor 466. Likewise, the second conductor 476 and the third conductor can act as source and drain, respectively, relative to each other. Such repeating source/drain configuration can continue as to yield a desired number of cascading stages of transistors that can be utilized as a series of RF switches.

Figure 18A:
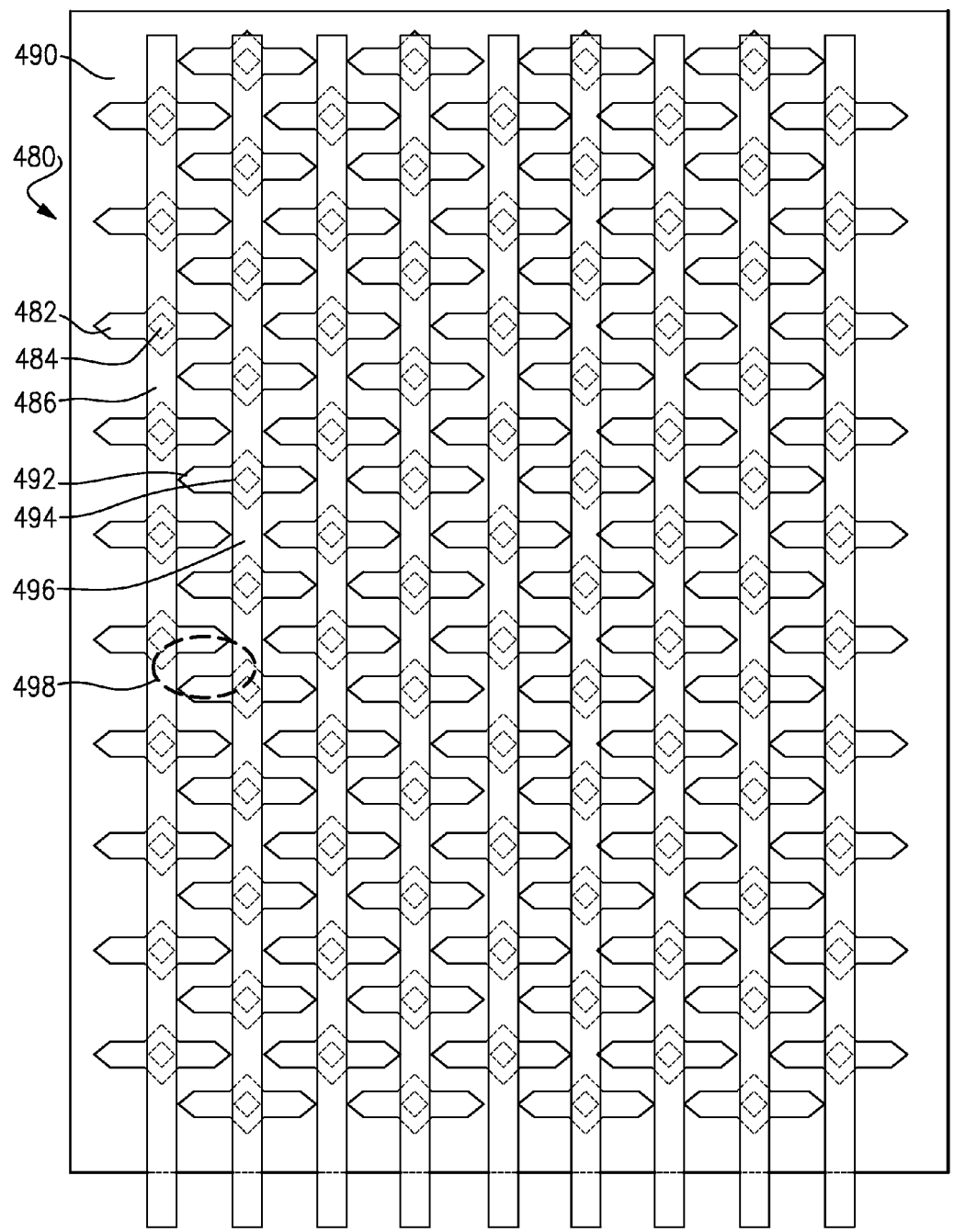
FIG. 18A shows an example array of FET devices having a shape that is a variation of the example shape of FIG. 17.

FIG. 18A shows a plan view of a configuration 480 where implant/diffusion regions 482, 492 include a shape that can be a variation of the diffusion regions 462, 472 of FIG. 17. The corners of the ends of the rectangular shape are shown to be beveled so as to yield pointed ends. As shown, the diffusion regions 482, 492 are arranged so that their length direction is along X direction. Conductors 486 and 496 are shown to extend along Y direction so as to connect centers of their respective diffusion regions. The diffusions regions 482 and the diffusion regions 492 are offset from each other so as to be staggered with each other along both X and Y directions. As shown, the diffusion regions can be arranged so that two neighboring regions belonging to two groups face each other as indicated by 498. In this particular example, upper left edge of the rectangle and the upper left edge of the rhombus of one region are shown to face the lower right edge of the rectangle and the lower right edge of rhombus of the other region.

The example configuration 480 is shown to include a gate material 490 formed between the diffusion regions 482, 492. Further, the example configuration 480 is shown to include electrical contact structures 484, 494 on each of the respective diffusion regions 482, 492. In other embodiments, each diffusion region can include other numbers of such electrical contact structures. Such contact structures can include, for example, a pad and/or a via. The contact structures 484, 494 are shown to be electrically connected in groups by the conductors 486, 496.

In some embodiments, the example device 480 can be configured as a single FET device with every other conductor representing a source (or a drain) and the other conductors representing a drain (or a source) of the single FET device. In such an embodiment, a plurality of such source/drain regions can be connected in parallel. For example, if the first conductor 486 is a source, then all of the diffusion regions connected to it can act as source regions. Then, the second conductor 496 and its connected diffusion regions can act as a drain. Thus, any other odd-numbered conductors and their respective diffusion regions can act as sources connected in parallel to the first conductor. Likewise, any other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 480 can be configured so as to provide a plurality of cascading stages of transistors arranged in series. For example, if the first conductor 486 is a source, then all of the diffusion region(s) connected to it can act as source region(s). The second conductor 496 and its connected diffusion regions can act as a drain relative to the first conductor 486. Likewise, the second conductor 496 and the third conductor can act as source and drain, respectively, relative to each other. Such repeating source/drain configuration can continue as to yield a desired number of cascading stages of transistors that can be utilized as a series of RF switches.

Figure 18B:
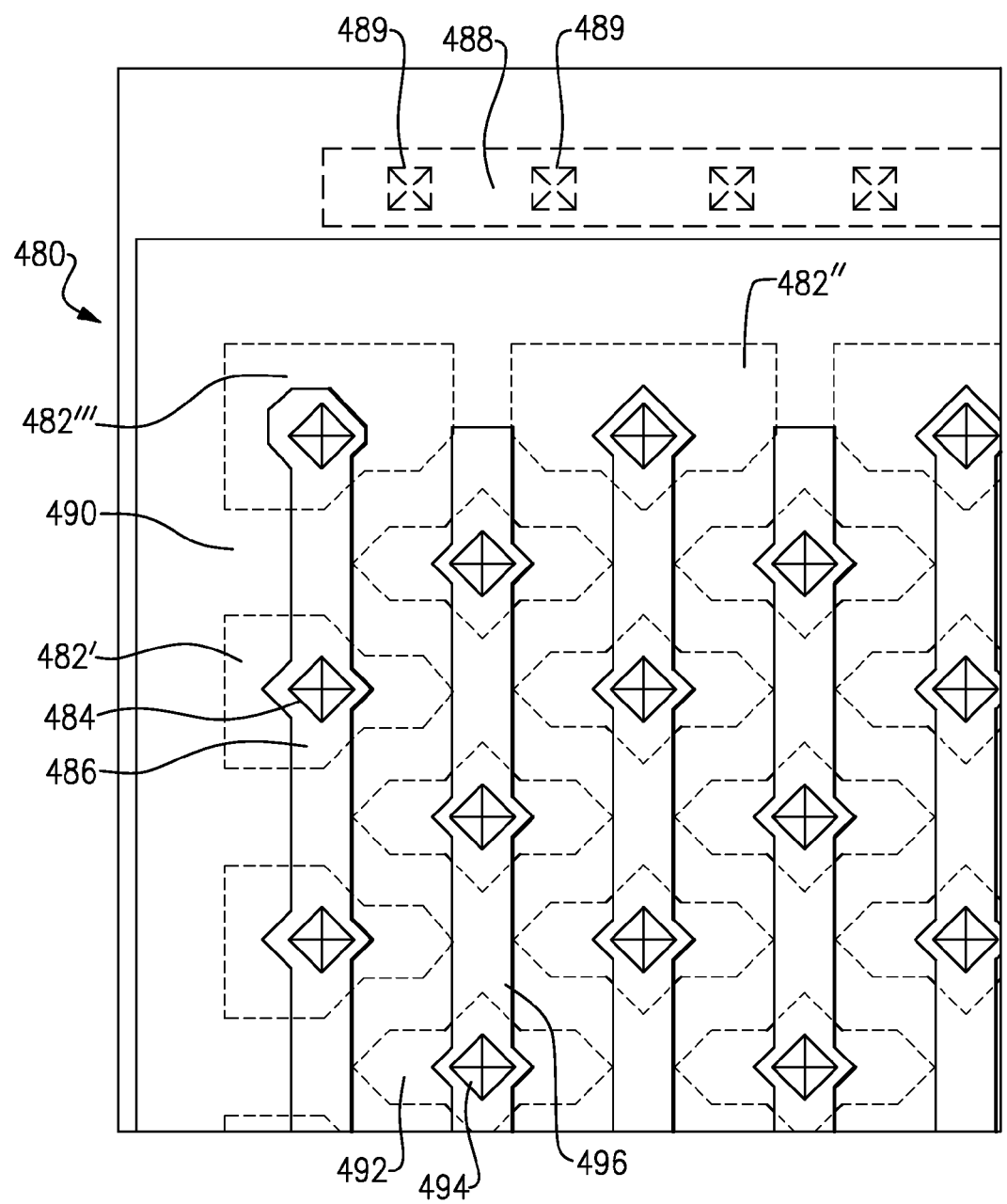
FIG. 18B shows an example of how edges and/or corners of the example array of FIG. 18A can be configured.

FIG. 18B shows an example of how edges and corners of a FET device 480 (such as the example of FIG. 18A) can be configured. In the example, implant/diffusion regions (e.g., 492) that are not along an edge are depicted as having a similar shape as that of FIG. 18A. In some embodiments, implant/diffusion regions along an edge of the FET device can be shaped to retain similar facing configuration (e.g., 498 in FIG. 18A) with corresponding neighboring inner implant/diffusion regions, as well as to accommodate the edge. For example, each of the edge regions (indicated as 482') has a right side shape similar to those of inner regions 482, and a left side shape that is squared to accommodate the left edge of the FET device. In another example, each of the edge regions (indicated as 482") along the upper edge has a lower side shape similar to those of inner regions 482, and an upper side shape that is squared to accommodate the left edge of the FET device.

In some embodiments, implant/diffusion regions at a corner of a FET device can be shaped to retain similar facing configuration (e.g., 498 in FIG. 18A) with one or more neighboring inner implant/diffusion regions, as well as to accommodate the corner. For example, a corner region (indicated as 482''') has a lower right corner shape selected to yield the similar facing configuration as others (e.g., 498 in FIG. 18A) with one or more corresponding inner implant/diffusion regions; and the remaining portions of the corner region 482''' are shown to accommodate the respective edges, the respective corner, and the neighboring regions (e.g., 482' and 482").

As with the example configuration of FIG. 18A, an electrical contact structure 484, 494 is shown to be disposed at each of the implant/diffusion regions (482, 482', 482", 482''', 492) in FIG. 18B. Such contact structures can include, for example, a pad and/or a via. The contact structures 484, 494 are shown to be electrically connected in groups by the conductors 486, 496. In some embodiments, the conductors 486, 496 can be dimensioned to accommodate the shape of the contact structures 484, 494 and/or the shape of the implant/diffusion regions. For example, the contact structures at non-corner edge regions, as well as inner regions can be shaped to accommodate the contact structures 484, 494. In another example, the contact structure at the corner region 482''' can be shaped to accommodate the contact structure 484 as well as the corner region 482'''.

In the example shown in FIG. 18B, the first group of conductors 486 can be connected to a first common terminal that serves as a terminal for one of a source and a drain. In some embodiments, such a common terminal (not shown) can be formed over the gate material (e.g., along one of the edges of the FET device). Similarly, the second group of conductors 496 can be connected to a second common terminal that serves as a terminal for the other of the source and the drain. In some embodiments, such a common terminal (not shown) can be formed over the gate material (e.g., along one of the edges of the FET device).

In some embodiments, the body of the FET device can be floating, or can be provided with a bias. In the example shown in FIG. 18B, the latter can be accommodated by a connection port 488 that is connected to a plurality of contact structures 489. Such contact structures (489) can be connected to a conductive layer (not shown) in electrical contact with the body portion of the FET (e.g., through body contacts).

Figure 19:
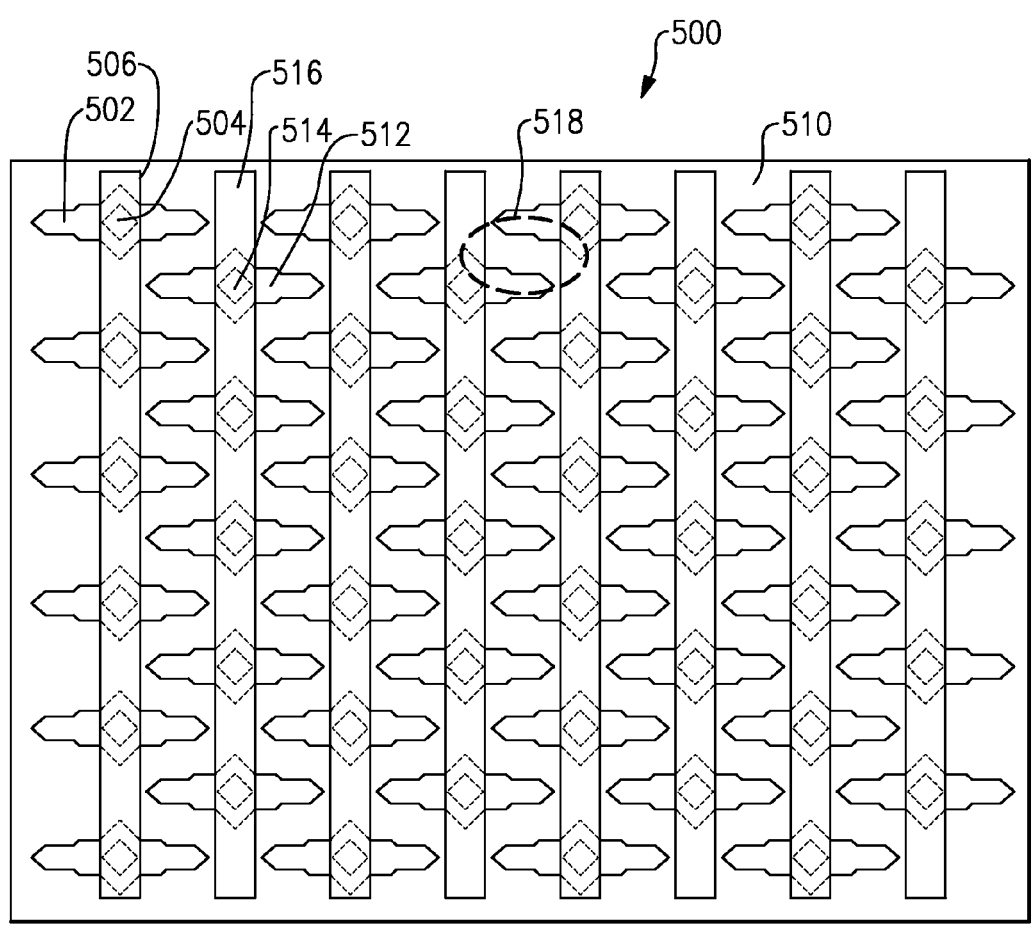
FIG. 19 shows an example array of FET devices having a shape that is a variation of the example shape of FIG. 18.

FIG. 19 shows a plan view of a configuration 500 where implant/diffusion regions 502, 512 include a shape that can be a variation of the diffusion regions 482, 492 of FIG. 18. The length-wise portion that extends along the X direction is shown to start at a given width at the center, taper down to smaller-width portions, and end with opposing pointed ends. Conductors 506 and 516 are shown to extend along Y direction so as to connect centers of their respective diffusion regions. The diffusions regions 502 and the diffusion regions 512 are offset from each other so as to be staggered with each other along both X and Y directions. As shown, the diffusion regions can be arranged so that two neighboring regions belonging to two groups face each other as indicated by 518. In this particular example, upper right edges of the tapered portion and the upper right edge of the rhombus of one region are shown to face the lower left edges of the tapered portion and the lower left edge of the rhombus of the other region.

The example configuration 500 is shown to include a gate material 510 formed between the diffusion regions 502, 512. Further, the example configuration 500 is shown to include electrical contact structures 504, 514 on each of the respective diffusion regions 502, 512. In other embodiments, each diffusion region can include other numbers of such electrical contact structures. Such contact structures can include, for example, a pad and/or a via. The contact structures 504, 514 are shown to be electrically connected in groups by the conductors 506, 516.

In some embodiments, the example device 500 can be configured as a single FET device with every other conductor representing a source (or a drain) and the other conductors representing a drain (or a source) of the single FET device. In such an embodiment, a plurality of such source/drain regions can be connected in parallel. For example, if the first conductor 506 is a source, then all of the diffusion regions connected to it can act as source regions. Then, the second conductor 516 and its connected diffusion regions can act as a drain. Thus, any other odd-numbered conductors and their respective diffusion regions can act as sources connected in parallel to the first conductor. Likewise, any other even-numbered conductors and their respective diffusion regions can act as drains connected in parallel to the second conductor. In some embodiments, such an assembly of sources and drains connected in parallel and providing a single FET functionality can be utilized as one stage of an RF switch having a plurality of stages. Such plurality of stages can include a plurality of similarly configured FETs, or a combination of differently configured FETs.

In some embodiments, the example device 500 can be configured so as to provide a plurality of cascading stages of transistors arranged in series. For example, if the first conductor 506 is a source, then all of the diffusion region(s) connected to it can act as source region(s). The second conductor 516 and its connected diffusion regions can act as a drain relative to the first conductor 506. Likewise, the second conductor 516 and the third conductor can act as source and drain, respectively, relative to each other. Such repeating source/drain configuration can continue as to yield a desired number of cascading stages of transistors that can be utilized as a series of RF switches.

In some implementations, some or all of the example configurations described in reference to FIGS. 8-19 can be configured to accommodate edges and/or corners of their respective FET devices, in manners similar to the example described in reference to FIG. 18B.

Figure 20:
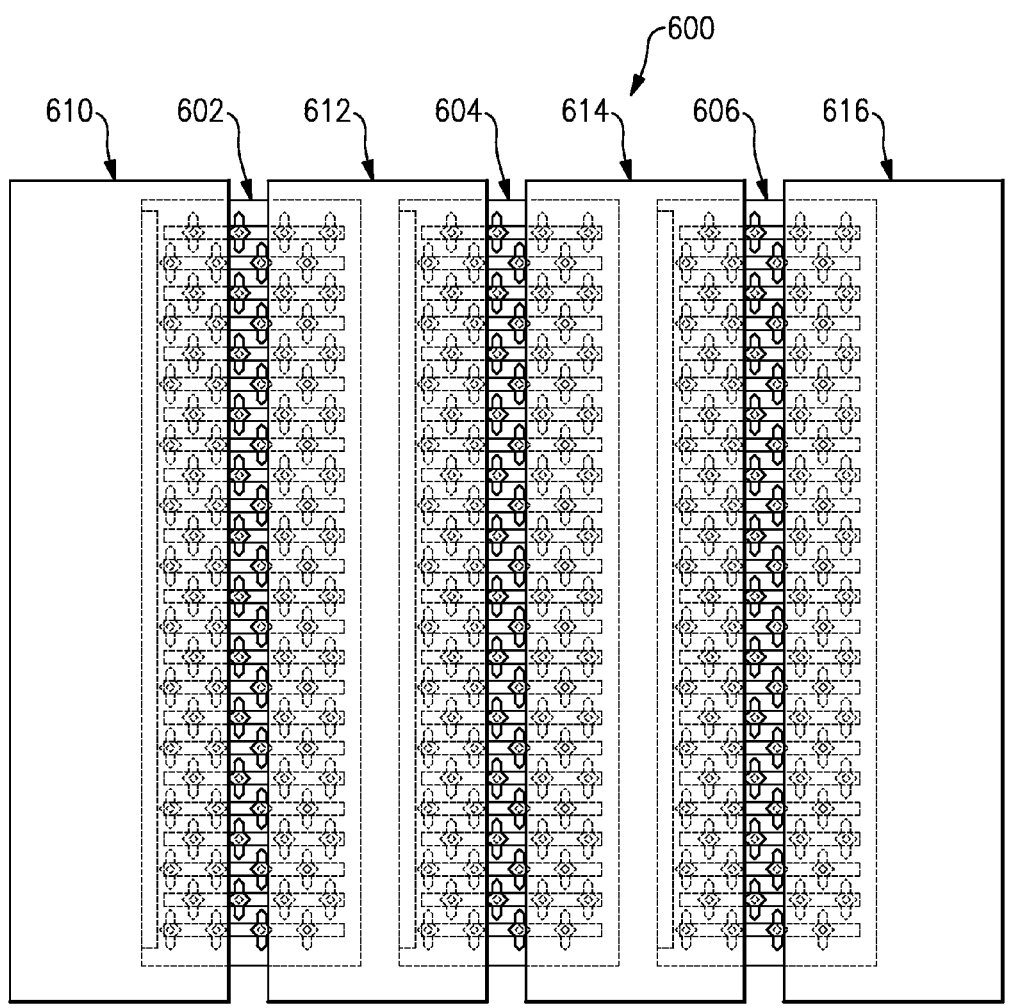
FIG. 20 shows an example of a metal interconnect configuration for interconnecting source and drain regions of an array of FET devices.

FIG. 20 shows an example of how a plurality of FET devices can be connected in an assembly so as to provide a desirable voltage dividing functionality. For the purpose of describing the example of FIG. 20, it is assumed that a single FET device can be configured so that every other conductor is connected to one or more source (or drain) regions and the other conductors connected to one or more drain (or source) regions (such as those described in reference to FIGS. 8-19), such that a plurality of such source/drain regions are electrically connected in parallel.

FIG. 20 shows an example configuration 600 where three FET devices 602, 604, 606 are connected in series. Suppose that a conductive layer 610 is a source terminal for the three-FET configuration 600. Then, a conductive layer 616 can be a drain terminal. The source layer 610 can be connected to source conductors (e.g., every other conductor strip) of the first FET 602 but be electrically isolated from the first FET's drain conductors. A conductive layer 612 can be configured to be connected to the drain conductors of the first FTE 602 and source conductors of the second FET 604, but be electrically isolated from the first FET's source conductors and the second FET's drain conductors. Similarly, a conductive layer 614 can be configured to be connected to the drain conductors of the second FTE 604 and source conductors of the third FET 606, but be electrically isolated from the second FET's source conductors and the third FET's drain conductors. The drain layer 616 can be connected to drain conductors of the third FET 606 but be electrically isolated from the third FET's source conductors.

Figure 21:
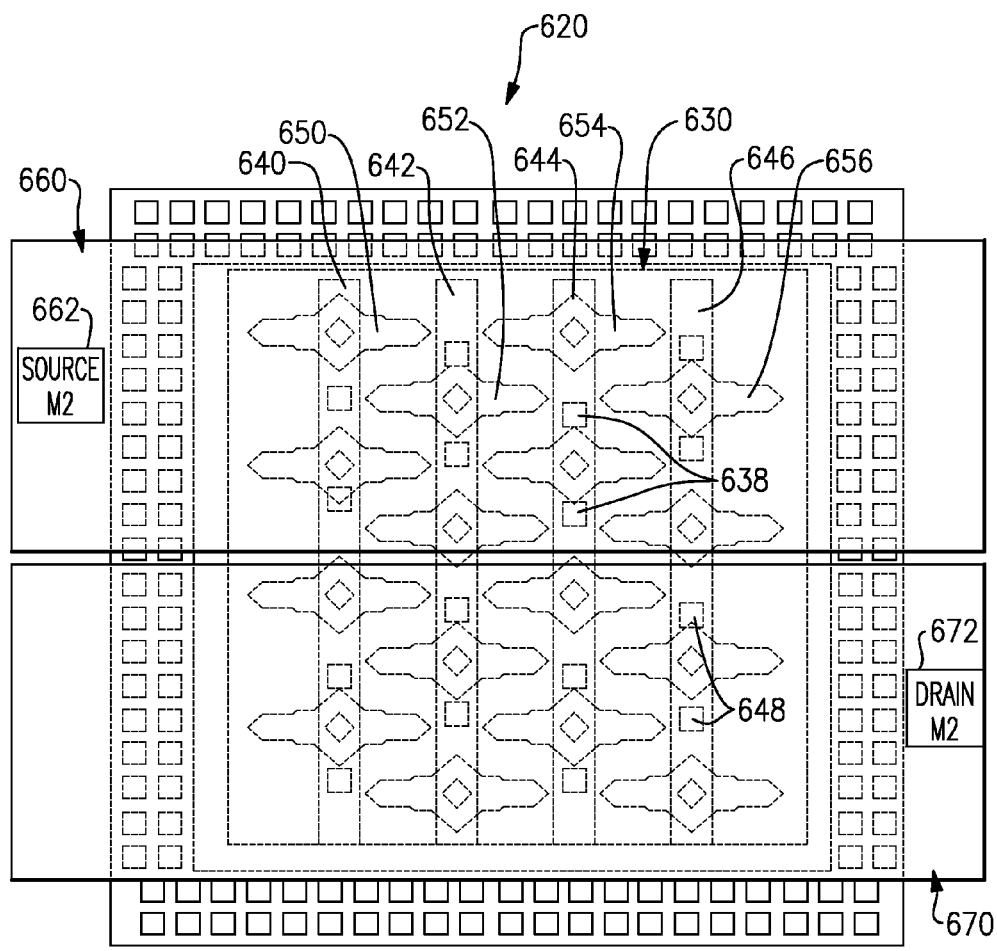
FIG. 21 shows an example of a variation of the configuration of FIG. 20.

FIG. 21 shows another example of how a given FET device can be configured so as to provide a collective source and a collective drain. For the purpose of describing the example of FIG. 21, it is assumed that the FET device can be configured so that every other conductor is connected to one or more source (or drain) regions and the other conductors connected to one or more drain (or source) regions (such as those described in reference to FIGS. 8-19), such that a plurality of such source/drain regions are electrically connected in parallel.

FIG. 21 shows an example configuration 620 where a single FET device 630 can be divided into a collective source and a collective drain. A conductive layer 660 is shown to be connected to a source terminal 662, and a conductive layer 670 is shown to be connected to a drain terminal 672. Suppose that the source layer 660 is connected to first (640) and third (644) conductors from the left and their respective diffusion regions (650, 654) (e.g., through vias 638), but electrically isolated from the second (642) and fourth (646) conductors and their respective diffusion regions (652, 656). Then, the drain layer 670 can be connected to the second (642) and fourth (646) conductors and their respective diffusion regions (652, 656) (e.g., through vias 648), but electrically isolated from the first (640) and third (644) conductors and their respective diffusion regions (650, 654).

As understood in the art, notable factors that contribute to Rds-on of a FET can include channel properties, contact resistance of the terminals for the two S/D regions, and properties associated with the two S/D regions. Assuming that the contact resistances remain generally the same, effects of different shapes of the S/D regions have been evaluated for different shapes.

A comparison of performances of a rectangular shaped source/drain configuration and a diamond shaped source drain configuration were performed. The channel component of Rds-on was numerically evaluated with HSpice on a simple finger-configuration (rectangular shaped) NMOS device. The example device had an aspect ratio W/L of about 10 μm/0.32 μm. This particular example NMOS aspect ratio corresponds roughly to a single finger of a typical RF switch TX-arm stack. A numerically calculated value of about 2.46 Ω for Rds-on was obtained from the HSpice evaluation, and such a value was then used to calibrate an effective channel doping for the device geometry using 2-D EM simulation. This can be accomplished by running PISCES algorithm iteratively on the finger geometry, and varying the channel doping until the cell's Rds-on approximately matches the 2.46 Ω value. Once calibrated, the corresponding doping level can then be used in a model for the diamond geometry NMOS device.

Figure 22:
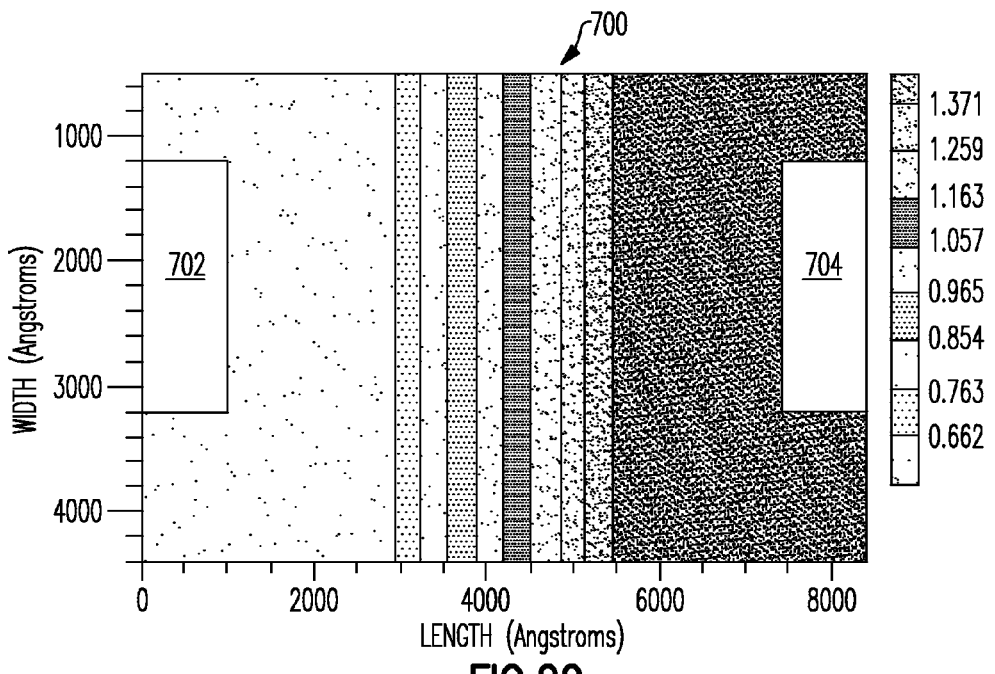
FIG. 22 shows an electric potential contour pattern between source and drain of a rectangular shaped FET device.
Figure 23:
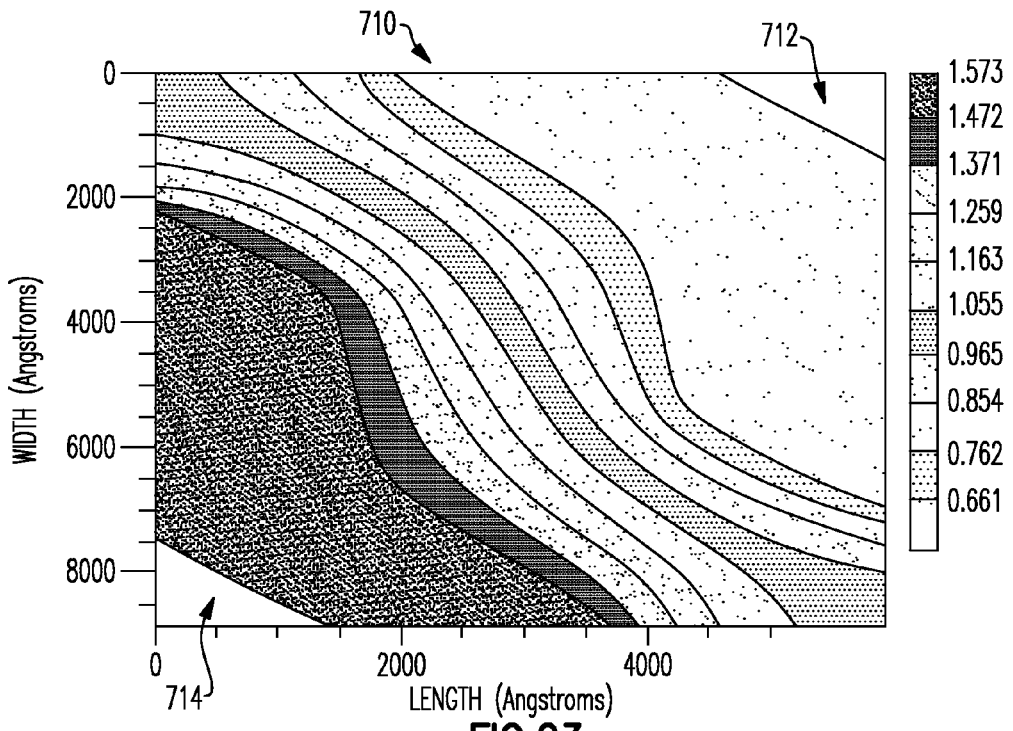
FIG. 23 shows an electric potential contour pattern between source and drain of a diamond shaped FET device.

The example dimensions of the foregoing rectangular and diamond geometries (700 and 710) are shown in FIGS. 22 and 23. In FIG. 22, the rectangular shaped diffusion regions are depicted as 702 and 704; and their dimensions and separation are shown on the scales. In FIG. 23, portions of the diamonds (712, 714) that face each other are shown; and their dimensions and separation are shown on the scales. In each of FIGS. 22 and 23, the values associated with the contour scales along the right sides of the plots are electrical potential values in volts.

FIGS. 22 and 23 also show electrical potential contour plots for the rectangular and diamond configurations. Such potential contour plots were obtained by generating a PISCES geometry file (*.mesh) by an appropriated configured open-source programs such as EasyMesh. Such a program can partition a 2-dimensional region into an array of triangles such as those shown in FIGS. 22 and 23.

Based on the foregoing example analyses, the rectangular configuration yields a calculated product of Rds-on and area of about $(33.8\ k\Omega)(0.84\ \mu m)(0.44\ \mu m)=12.5\ k\Omega\cdot\mu m^2$. For the diamond configuration, such a product of Rds-on and area is calculated to be about $(17.5\ k\Omega)(0.594\ \mu m)(0.887\ \mu m)=9.2\ k\Omega\cdot\mu m^2$ which is about 26% less than that of the rectangular case.

In some implementations, some or all of the examples described herein in reference to 9-21 can have (Rds-on)(area) products lower than both of the rectangular and diamond cases. Other configurations different than the rectangular and diamond configurations can also be provided so as to yield such desirable reduced values of (Rds-on)(area) products.

FIG. 24 shows a process 800 that can be implemented to fabricate FET structures associated with the examples described herein. FIG. 25 shows structures at different stages corresponding to the various steps of the process 800 of FIG. 24.

In block 812, an SOI structure having an isolated well of an insulator layer can be formed or provided, so as to yield a structure 820 where the well is indicated as 828 and the insulator layer is indicated as 824. A substrate 822 below the insulator layer 824, as well as an insulator 826 that isolates the well 828 are also shown.

In block 814, diffusion regions can be formed in the well, such that the regions have footprints that include facing portions that either include at least one portion having a plurality of segments extending in different directions, or defining opposing sides of a non-rectangular quadrilateral. In some embodiments, such facing portions can define opposing sides of a rectangle. Such a step can yield a structure 830 having a first diffusion region 832 and a second diffusion region 834 formed on the well 828. Such diffusion regions can be configured to function as source and drain individually or in conjunction with other diffusion regions.

In block 816, one or more electrical contact terminals can be formed on each of the diffusion regions. Such a step can yield a structure 840 having an electrical contact terminal 842 disposed on the first diffusion region 832 and an electrical contact terminal 844 disposed on the second diffusion region 834. Such electrical contact terminals can be connected to source and drain individually or in conjunction with other contact terminals.

Block 818 shows that in some implementations, a gate can be formed between the first diffusion region and the second diffusion region. Such a step can yield a structure 850 having a gate 852 disposed on the well 828 and between the first diffusion region 832 and the second diffusion region 834.

In some implementations, various example shapes associated with the diffusion regions, gate openings, contact pads, and/or conductors can be fabricated utilizing a number of process technologies. Such process technologies can include, for example, one or more masks having selected shapes that facilitate process steps such as photolithographic based steps involving etching, masking, deposition, and the like.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) switch comprising:
   a semiconductor substrate;
   an input assembly including a plurality of source regions formed on the semiconductor substrate, a source contact formed on each of the source regions, and an input conductor that electrically connects to each of the source contacts;
   an output assembly including a plurality of drain regions formed on the semiconductor substrate, a drain contact formed on each of the drain regions, and an output conductor that electrically connects to each of the drain contacts; and a gate layer disposed over the source and drain regions, the gate layer defining a first opening over each of the source regions and a second opening over each of the drain regions, at least some of the first and second openings arranged in a two-dimensional array, each of the first and second openings forming a double-diamond shaped diffusion region, the source regions, the drain regions, and the gate layer configured as one or more field effect transistors (FETs).

2. The RF switch of claim 1 further comprising an input terminal connected to the input conductor and an output terminal connected to the output conductor.

3. The RF switch of claim 1 wherein at least some of the first openings have an elongation axis along a first direction.

4. The RF switch of claim 3 wherein at least some of the second openings have an elongation axis extending along a second direction approximately perpendicular to the first direction.

5. The RF switch of claim 4 wherein each diamond in the double-diamond of the respective first and second openings has its center along the elongation axis of the respective opening.

6. The RF switch of claim 5 wherein a first group of first openings form corners of a first zigzag extending along the first direction.

7. The RF switch of claim 6 wherein a second group of second openings form corners of a second zigzag extending along the first direction, the first and second zigzags offset from one another in the second direction.

8. The RF switch of claim 7 further comprising at least one additional zigzag having additional first openings and extending along the first direction, and at least one additional zigzag having additional second openings and extending along the first direction, the additional zigzags offset from one another in the second direction.

9. The RF switch of claim 7 wherein alternating corners of the first zigzag are aligned with alternating corners of the second zigzag along the first direction.

10. The RF switch of claim 4 wherein each of the input conductor and the output conductor extends along the second direction.

11. The RF switch of claim 1 wherein a neighboring pair of first and second openings includes a first facing portion for the first opening in the pair and a second facing portion for the second opening in the pair, the first and second facing portions defining a facing area therebetween.

12. The RF switch of claim 11 wherein the facing area defined by the first and second facing portions of the neighboring pair of first and second openings defines a generally "V" shaped area.

13. The RF switch of claim 1 wherein the source regions, the drain regions, and the gate are configured as a metal-oxide-semiconductor FET (MOSFET).

14. The RF switch of claim 1 further comprising an insulator layer disposed below the semiconductor substrate that includes a silicon substrate to yield a silicon-on-insulator (SOI) structure.

15. The RF switch of claim 1 wherein the first and second openings are dimensioned to yield a reduced value of Rds-on per area when compared to a transistor having similarly sized rectangular openings.

16. The RF switch of claim 1 wherein a neighboring pair of first and second openings includes a first facing portion for the first opening in the pair and a second facing portion for the second opening in the pair, and the first and second facing portions define a generally saw-tooth facing area therebetween.

17. A radio-frequency (RF) switching module, comprising:
a packaging substrate configured to receive plurality of components;
a die mounted on the packaging substrate, the die having a plurality of transistors implemented on a semiconductor substrate, each transistor including a plurality of source regions and a plurality of drain regions, each transistor further including a gate layer disposed over the source and drain regions, the gate layer defining a first opening over each of the source regions and a second opening over each of the drain regions, at least some of the first and second openings arranged in a two-dimensional array, each of the first and second openings forming a double-diamond shaped diffusion region, each transistor further including a source contact formed on each source region, and a drain contact formed on each drain region, the die further including an input conductor that electrically connects the source contacts, and an output conductor that electrically connects the drain contacts; and
a plurality of connectors configured to provide electrical connections between the die and the packaging substrate, the source regions, the drain regions, and the gate layer configured as one or more field effect transistors (FET's).

18. The RF switching module of claim 17 wherein a neighboring pair of first and second openings includes a first facing portion for the first opening in the pair and a second facing portion for the second opening in the pair, and the first and second facing portions define a generally "V" shaped facing area therebetween.

19. A radio-frequency (RF) device, comprising:
a transceiver configured to process RF signals;
a power amplifier configured to amplify an RF signal generated by the transceiver;
an antenna in communication with the transceiver and configured to facilitate transmission of the amplified RF signal; and
a switching module coupled to the power amplifier and the antenna, the switching module configured to route the amplified RF signal from the power amplifier to the antenna, the switching module having a switch circuit including a plurality of transistors connected in series, each transistor including a plurality of source regions and a plurality of drain regions, each transistor further including a gate layer disposed over the source and drain regions, the gate layer defining a first opening over each of the source regions and a second opening over each of the drain regions, at least some of the first and second openings arranged in a two-dimensional array, each of the first and second openings forming a double-diamond shaped diffusion region, each transistor further including a source contact formed on each source region, and a drain contact formed on each drain region, the source contacts connected to an input conductor for receiving the amplified RF signal, the drain contacts connected to an output conductor for outputting the amplified RF signal, the source regions, the drain regions, and the gate layer configured as one or more field effect transistors (FET's).

20. The RF device of claim 19 wherein the RF device is a portable wireless device.

* * * * *